(12) United States Patent
Larsson et al.

(10) Patent No.: US 7,920,501 B2
(45) Date of Patent: Apr. 5, 2011

(54) METHOD AND ARRANGEMENT FOR BI-DIRECTIONAL RELAYING IN WIRELESS COMMUNICATION SYSTEMS

(75) Inventors: Peter Larsson, Solna (SE); Niklas Johansson, Sollentuna (SE); Kai-Erik Sunell, Bromma (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 941 days.

(21) Appl. No.: 11/794,473

(22) PCT Filed: Dec. 22, 2005

(86) PCT No.: PCT/SE2005/002042
§ 371 (c)(1),
(2), (4) Date: Jun. 29, 2007

(87) PCT Pub. No.: WO2006/071187
PCT Pub. Date: Jul. 6, 2006

(65) Prior Publication Data
US 2009/0268662 A1  Oct. 29, 2009

(30) Foreign Application Priority Data
Dec. 30, 2004 (SE) ...................................... 0403218

(51) Int. Cl.
H04B 7/14 (2006.01)
(52) U.S. Cl. ........................................ 370/315; 370/352
(58) Field of Classification Search .................. None
See application file for complete search history.

(56) References Cited

U.S. PATENT DOCUMENTS

| 5,596,439 A | 1/1997 | Dankberg et al. |
| 2003/0031198 A1* | 2/2003 | Currivan et al. ............... 370/465 |
| 2004/0114576 A1* | 6/2004 | Itoh et al. ....................... 370/352 |

FOREIGN PATENT DOCUMENTS

| CN | 1171555 A | 1/1998 |
| CN | 1192305 A | 9/1998 |
| JP | 9-179951 | 7/1997 |
| JP | 2004-510380 | 2/2004 |
| WO | WO 97/05711 | 2/1997 |
| WO | WO 02/27939 | 4/2002 |
| WO | WO 2004/107693 | 12/2004 |

OTHER PUBLICATIONS

International Search Report mailed Jun. 8, 2006.
International Preliminary Report of Patentability.

(Continued)

*Primary Examiner* — Erika A Gary
(74) *Attorney, Agent, or Firm* — Nixon & Vanderhye P.C.

(57) ABSTRACT

A relaying node is in bidirectional communication with at least a first and a second sending/receiving radio node, and the relaying radio node receives at least a first signal carrying at least first data and a second signal carrying at least second data. The relaying node generates a reduced representation of at least the first and second signal, with a reduced information content as compared to the first and second data, by a joint non-linearly encoding operation, and transmits the reduced representation to at least the first and the second communication node. The first and second sending/receiving node can extract data from the reduced representation by a non-linear decoding operation using stored a priori information.

52 Claims, 10 Drawing Sheets

OTHER PUBLICATIONS

Yong S. & Sung L.B.: "XOR Retransmission in Multicast Error Recovery," Networks (ICON 2000) Proceedings. IEEE International Conference, pp. 336-340.

Translation of Chinese official action, Aug. 3, 2010, in corresponding Chinese Application No. 200580048749.2.

Summary of Japanese official action, Nov. 1, 2010, in corresponding Japanese Application No. 2007-549320.

Wu et al., Minimum-Energy Multicast in Mobile Ad hoc Networks Using Network Coding, IEEE Information Theory Workshop, IEEE Xplore, Oct. 29, 2004, pp. 304-309.

Ahlswede et al., Network Information Flow, IEEE Transactions on Information Theory, IEEE Xplore, Jul. 2000, vol. 46, Issue 4, pp. 1204-1216.

* cited by examiner

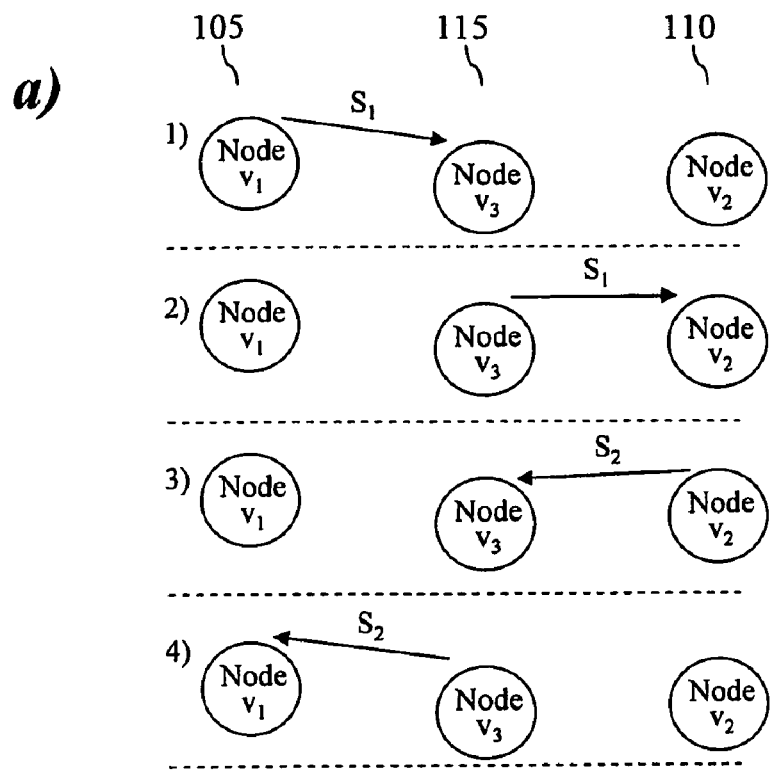
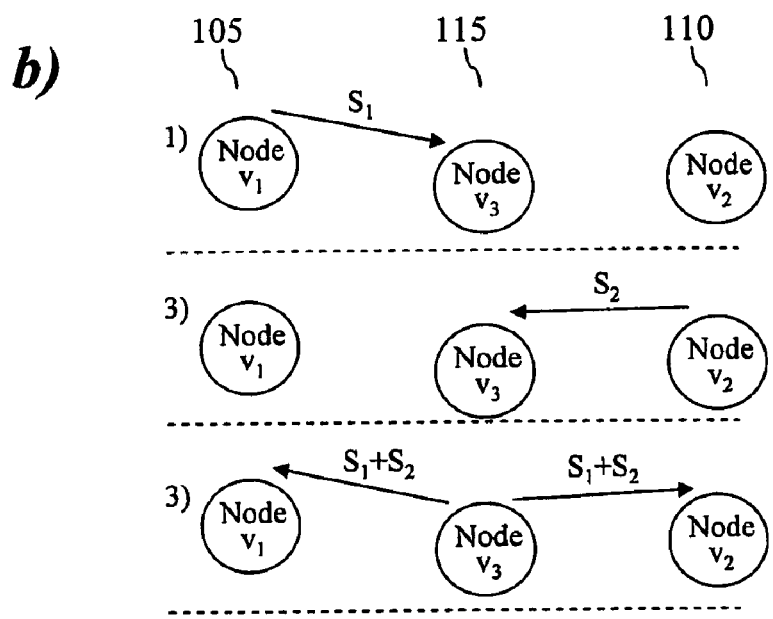
Fig. 1a-b Prior Art

METHOD AND ARRANGEMENT FOR BI-DIRECTIONAL RELAYING IN WIRELESS COMMUNICATION SYSTEMS

This application is the U.S. national phase of International Application No. PCT/SE2005/002042 filed 22 Dec. 2005 which designated the U.S. and claims priority to SE 0403218-1 filed 30 Dec. 2004, the entire contents of each of which are incorporated herein by reference.

TECHNICAL FIELD

The technology described in this application relates to a wireless communication system utilizing bi-directional relaying. In particular, the method and arrangement relates to a relaying node forming and transmitting a composite data packet comprising information from at least two previously received data packets.

BACKGROUND

A main driving force in the development of wireless/cellular communication networks and systems is to provide, apart from many other aspects, increased coverage or support of higher data rate, or a combination of both. At the same time, the cost aspect of building and maintaining the system is of great importance and is expected to become even more so in the future. As data rates and/or communication distances are increased, the problem of increased battery consumption is another area of concern.

Until recently the main topology of wireless networks has been fairly unchanged, including the three existing generations of cellular networks. The topology is characterized by the cellular architecture with fixed radio base stations (BS) and mobile stations (MS) as the (wireless) transmitting and receiving entities in the networks, wherein a communication typically only involves these two entities.

Attention has recently been given to other types of topologies utilizing relaying to enhance the performance of the system. In its simplest form, a relay system can be seen as a relay station (RS) positioned in-between the base station and the mobile station that repeats and amplify the transmissions in both directions. A slightly more advanced relaying scheme demodulate and decode its received signals prior re-encoding and re-modulating the signal prior forwarding it to the next station.

This, for example, increases the coverage of the base station. Even more elaborate relaying systems, for example systems utilizing cooperative relaying, as described in WO04107693, may give substantially improved performance with regards to throughput, power efficiency and/or capacity. In cooperative relaying, typically a plurality of in parallel operating relay stations are engaged in the communication between the two end nodes, for example a base station and a mobile station.

A related approach to a relay oriented communication systems are exemplified by multihop, or ad-hoc, networks, wherein typically, in a wireless scenario, a communication involves a plurality of transmitting and receiving entities forwarding information towards one or more destination station. Such systems offer possibilities of significantly reduced path loss between communicating (relay) stations that may benefit the end-to-end (ETE) users. Although different in many aspects, the relay enhanced cellular systems and the multihop systems share the concept of relaying information in at least two hops between the end-to-end users.

In classical communication between nodes utilizing relaying, transmissions from the relay station generally operates by sending data packets to different nodes over orthogonal resources, such as consecutive timeslots. The basic prior-art scheme for communication over a relay station can be seen as a four-phase protocol as shown in FIG. 1a, wherein (1) to (4) represent different time instances. The end nodes $v_1$ and $v_2$, for example a base station 105 and a mobile station 110, are engaged in bidirectional communication via a third node $v_3$, a relay station 115. At the first phase (1) the base station 105 transmit a signal $S_1$ to the relay station 115, which in the second phase (2), transmit the received signal $S_1$ to the mobile station 110. In the same manner the relay station 115 transmit a signal $S_2$ in the other direction. that it received from mobile station 110 in the third phase and that it transmits to base station 105 in the fourth (4) phase. The order of the four phases is exemplary and could be, to some extent, interchanged. The transmission performed by the relay station 115 may be a simple amplification and forwarding, or alternatively the signal may be decoded, re-modulated and forwarded. The former is known as amplify-and-forward, or non-regenerative relaying whereas the latter is known as decode-and-forward or regenerative relaying. Both regenerative and non-regenerative relaying is well known, e.g. in traditional multihopping and repeater solutions respectively. Various aspects of the two approaches are addressed in WO04107693. Regardless of if the transmission is regenerative or non-regenerative the traditional relaying concepts comprises at least four separate transmissions for bi-directional traffic.

Improvements to the traditional relaying protocol requiring four phases have been disclosed in U.S. Pat. No. 5,596,439. This method utilizes a priori known information of transmitting stations to enhance throughput. More precisely, U.S. Pat. No. 5,596,439 teaches a method of analogue and linear interference cancellation of a priori known own generated information in a bi-directional three-node satellite communication network. The concept, as illustrated in FIG. 1b, involves two nodes exchanging information through an intermediate relay station. The first node $v_1$ 105 transmit a first signal $S_1$ and stores its own transmitted signal $S_1$ (1). The second node $v_2$ 110 transmits and stores its signal $S_2$ (2). The intermediate node $v_3$, the relaying node 115, having received both signals, concurrently transmit signals $S_1$ and $S_2$ to both the first and second nodes $v_1$ and $v_2$ (3). With the use of their respective a priori known information, the own transmitted signal, the first node will, prior to demodulation, cancel $S_1$ to extract $S_2$ and the second node will, prior to demodulation, cancel $S_2$ to extract $S_1$. In this way the first node may properly decode $S_2$ and the second node $S_1$, with a reduced number of transmissions compared to the traditional relaying protocol. If the first transmissions from the first and second nodes are concurrent, the intermediate node $v_3$ 115 may receive superimposed signals from both nodes prior to relaying it. As both nodes can receive the superimposed signal they may subtract the interference caused by the a priori known signal by properly adjusting phase, delay and amplitudes for the cancellation. Thereby a protocol with only two phases is suggested.

The methods and arrangement described in the document mentioned above introduce improvements as compared to the traditional four-step scheme. However, the a priori information is in the prior art not utilized in an optimal way and further gains in transmitted power and/or increased throughput is needed to meet the growing demands of increased coverage and data rates, for example.

SUMMARY

An improved bidirectional relaying method adapted for wireless communication systems is needed.

An object is to provide methods and arrangements that overcome the drawbacks of the prior art techniques.

The broadcast nature of the medium is utilized in the technology described in this application. Information is non-linear encoded in a relay node and correspondingly the information is non-linear decoded at the receiving nodes. In the non-linear decoding stored a priori known information is utilized. The a priori information may be "own generated" information, but also "received-and-forwarded" as well as "overheard" information can be exploited. The benefits of the non-linear en/de-coding over simple superposition as in the above cited prior art, is that transmit power, or equivalently energy, can be reduced.

The method is applicable in a relaying communication system, wherein a relaying node is in bidirectional communication with at least a first and a second sending/receiving radio node, and comprises the steps of:

the first sending/receiving node transmits a first signal with associated first data to the relaying node, and the second sending/receiving node, transmits a second signal with associated second data to the relaying node, and the first node and the second node store their respective transmitted signals, associated data or representations thereof, as at least a part of their respective a priori known information;

the relaying node receives the first and second signals;

the relaying node generates a reduced representation of the first and second signal with the use of a non-linear encoding operation;

the relaying node transmits the reduced representation to the first and to the second radio node;

the first and second sending/receiving node performs a non-linear decoding operation of the reduced representation with the use of its a priori known information, whereby extracting the second and first signal, respectively, or the second and first data, respectively.

In one example embodiment, the non-linear encoding and decoding (the XOR operation) is performed on two digital data sequences, and the non-linear encoded sequence resulting from the two digital data sequences is encoded with an forward error correction code when it is transmitted. This allows for low complexity encoding and decoding, and hence cost, while offering the benefit of reduced power, or equivalently energy, usage.

In another example embodiment, the non-linear encoding and decoding is performed on two complex base-band signals. This allows primarily for reduced power, or equivalently energy, usage, but also allowing for more flexibility in adjusting the transmit durations for the base-band signals to match each other.

Thanks to the method and arrangement, the transmit power, or alternatively energy, can be nearly optimally utilized in a relaying node, hence affecting the signal to noise ratio (SNR) of the received signals at the receiving nodes. This gain can be exploited in that the total throughput in the system can be increased, or alternatively, the used power reduced.

One advantage is that the energy received directly from an end node (by the other end node in receiving mode) can be utilised efficiently. In particular, this signal can be exploited together with the relayed signal to enhance the communication performance such as throughput and power/energy efficiency.

A further advantage is that the method and arrangement can be employed in systems using a large variety of transmission techniques, including, but not limited, to orthogonal frequency division multiplexing (OFDM), multiple input multiple output (MIMO), Code Division Multiple Access (CDMA), Spatial Division Multiplex Access (SDMA), cooperative relaying and adaptive beamforming.

Other objects, advantages and novel features will become apparent from the following detailed description when considered in conjunction with the accompanying drawings and claims.

BRIEF DESCRIPTION OF THE DRAWINGS

FIG. 1a is a schematic illustration of the transmission sequences in a wireless communication system according to the prior art methods of relaying signals, and 1b schematically illustrates a prior art transmission scheme utilizing stored a priori information for interference cancellation;

DETAILED DESCRIPTION

Figure 2:
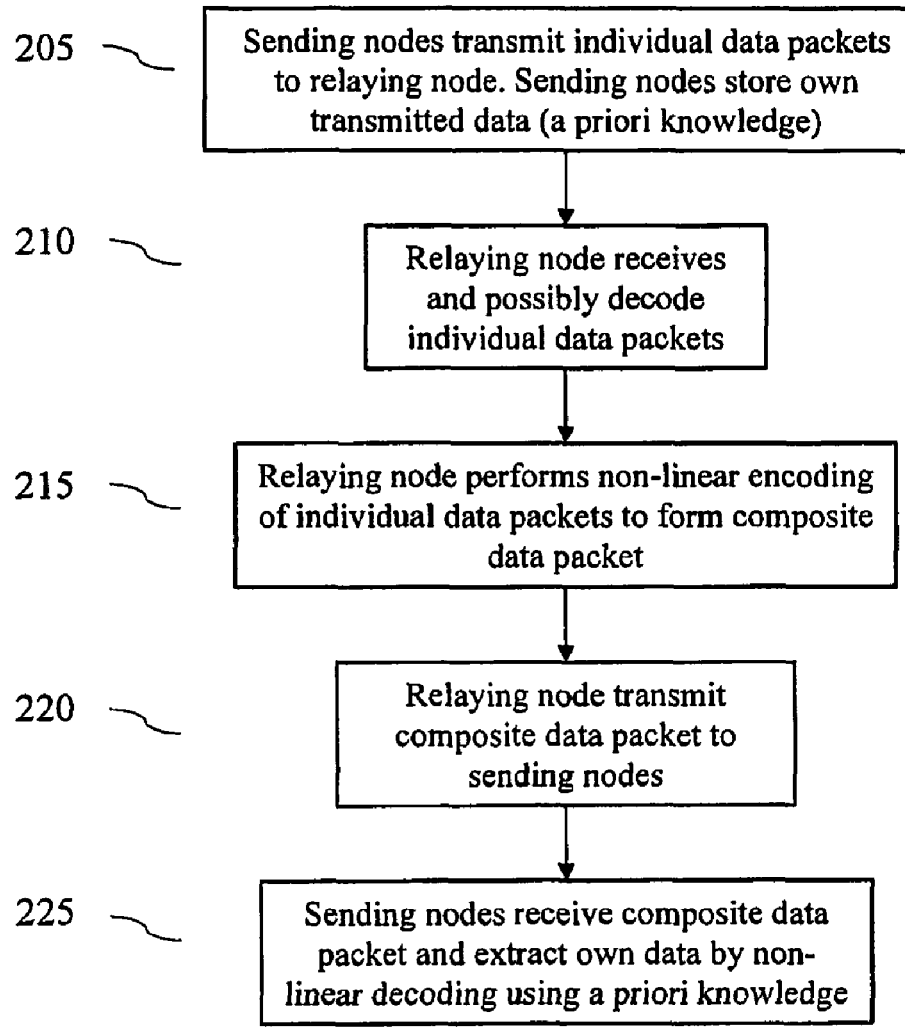
FIG. 2 is a flowchart of an example method.

The traditional 4-phase approach, as described with reference to FIG. 1, may be enhanced by the use of a priori known information for interferences cancellation in receiving nodes in a bidirectional relay system. However, in a system wherein the medium is of broadcast type, as in typical wireless cellular or wireless multihop networks, the broadcast characteristic of the channel is not optimally exploited by the proposed methods and arrangements. In particular:

the transmit power, or alternatively energy, is not optimally utilized in the relaying node, hence affecting the signal to noise ratio (SNR) of the received signals after interference cancellation at the receiving stations;

the energy received directly from an end node station (by the other end node in receiving mode) is not optimally exploited. In particular, this signal is not optimally exploited together with the relayed signal; and the receiver required for the previously proposed methods is complex.

The technology described in this application provides more energy-capacity efficient communication in channels with broadcast like characteristics. One example is for bidirectional communication between two nodes over one relay node(s). The two nodes can be two end nodes, for example a base station and a mobile station in a cellular system, utilizing a fixed relay station. Alternatively the two nodes can be consecutive nodes in a transmission chain in a multihop network. In this case all the nodes involved may be mobile stations and the transmission chain changing over time. For simplicity, and which is meant to be non-limiting examples, the method and arrangements are described primarily with reference to a cellular system, although the technology described in this application is equally well suitable for all systems wherein bidirectional relaying may occur, such as in multihop networks, or multihop through concatenation of (backhaul) microwave links. Hereinafter, the term relaying communication system is meant to encompass all systems utilizing any form of relaying, such as multihop, ad hoc networks, mesh networks, cooperative relaying etc.

The term nodes or radio nodes should be interpreted widely; any device capable of radio communication and compliant to the standards used in the wireless communication system can be seen as a node. Typically a radio node is capable of both sending and receiving data packets, which will be referred to as sending and receiving operation, respectively, or sending/receiving node meaning a node in sending/receiving operation. Nodes include, but is not limited to: radio base stations, relaying stations, mobile stations, laptop computers and PDAs equipped with wireless communication means and vehicles and machinery equipped with wireless communication means. The term relaying nodes, as used hereafter, refers to a node in relaying operation. It may be a dedicated relaying node, but also a sending/receiving node in a relaying operation mode.

In a communication system utilizing the arrangement and method of the present invention two nodes $v_1$ and $v_2$ are engaged in communication via a relaying node $v_3$. The first node $v_1$ transmit a first signal comprising at least first data to the relaying node $v_3$ and the second node $v_2$ transmit a second signal comprising at least second data to the relaying node $v_3$. The first and second nodes store their respective transmitted signals, or alternatively the comprised data or information content or a representation thereof, as respective a priori information. The relaying node receives the first and second signal from both nodes $v_1$ and $v_2$. The received signals may be received concurrently or at different occasions. The relaying node forms a reduced representation from the received at least two signals, with a reduced information content as compared with the original signals. In the forming of the reduced representation a non-linear encoding operation is utilized. The non-linear encoding operation may act on the first and second signals, on the first and second data comprised in the signals, on a signal of superimposed first and second signals, or combinations thereof. The reduced representation is subsequently transmitted by the relaying node $v_3$ to nodes $v_1$ and $v_2$. The non-linear encoding is designed to ensure that both node $v_1$ and $v_2$ receiving the reduced representation, can decode data destined for itself by utilizing a priori known information of own previously transmitted signals or data. The decoding processes in the receiving nodes exploits a corresponding non-linear decoding procedure.

A non-linear encoding is in this application defined as a mathematical operation through a function $f$ having the characteristics that two sequences $s_1(n)$ and $s_2(n)$, where $n=[1,N]$ and N is the number of symbols, multiplied with scalars a and b fulfil $$f(a \cdot s_1(n)+b \cdot s_2(n)) \neq a \cdot f(s_1(n))+b \cdot f(s_2(n)), \forall n$$

When operating with complex signals, real and imaginary parts may be treated independently.

In a communication system utilizing the arrangement and method two nodes $v_1$ and $v_2$ are engaged in communication via a relaying node $v_3$. The first node $v_1$ transmit a first signal comprising at least first data to the relaying node $v_3$ and the second node $v_2$ transmit a second signal comprising at least second data to the relaying node $v_3$. The first and second nodes store their respective transmitted signals, or alternatively the comprised data or information content or a representation thereof, as respective a priori information. The relaying node receives the first and second signal from both nodes $v_1$ and $v_2$. The received signals may be received concurrently or at different occasions. The relaying node forms a reduced representation from the received at least two signals, with a reduced information content as compared with the original signals. In the forming of the reduced representation a non-linear encoding operation is utilized. The non-linear encoding operation may act on the first and second signals, on the first and second data comprised in the signals, on a signal of superimposed first and second signals, or combinations thereof. The reduced representation is subsequently transmitted by the relaying node $v_3$ to nodes $v_1$ and $v_2$. The non-linear encoding is designed to ensure that both node $v_1$ and $v_2$ receiving the reduced representation, can decode data destined for itself by utilizing a priori known information of own previously transmitted signals or data. The decoding processes in the receiving nodes exploits a corresponding non-linear decoding procedure.

It should be noted that other types of encoding/decoding, for example Forward Error Correction (FEC), which are commonly used in communication system are not replaced by the non-linear encoding/decoding. On the contrary, the non-linear encoding may advantageously be used in conjunction with the common measures used to increase the throughput and reliability of a transmission such as encoding, adaptive modulation, checksums, retransmissions etc.

The net result is that the number of transmissions can be reduced compared to a traditional four-phase protocol. Compared to the prior art interference cancellation methods U.S. Pat. No. 5,596,439, the technology described in this application allows the peak and average transmit power to be significantly reduced for the relay station, for example given identical and fixed time transmissions, the relay station peak transmit power is reduced with around 6 dB and the average transmit power with 3 dB.

The operations of the method will be described with reference to the flowchart of FIG. 2 and the schematic transmission scheme of FIG. 3, wherein a first node 305 (node $v_1$), for example a base station 305, is engaged in communication with a second node (node $v_2$), for example a mobile station 310, via relaying node (node $v_3$), the relay station 315. It should be noted that the may be applied between any two communicating nodes, via one or more node(s) acting as a relay(s). The term "transmission of data packet" as used hereafter, involves using state of the art technique for communication such as applying modulation, Forward Error Correction (FEC) and Cyclic Redundancy Checks (CRC) at transmission. The reception of a data packet involves corresponding state of the art communication methods, such as demodulation, FEC decoding etc. The method comprises the steps of:

205: The first node $v_1$, transmit a first signal $S_1$ comprising first data $D_1$ designated for the second node $v_2$, via the relaying node $v_3$, and the second node $v_2$, transmit a second signal $S_2$ comprising the second data $D_2$ designated for the first node $v_1$, via the third node $v_3$. The first node $v_1$ and the second node $v_2$ store their respective transmitted data $D_1$ and $D_2$, the signals $S_1$ and $S_2$, or representations thereof, as at least a part of their respective a priori known information. The transmissions may be subsequent or concurrent.

210: The relaying node $v_3$, receives the signals $S_1$ and $S_2$. Alternatively, if the transmission from the first and second node was concurrent (and not orthogonal) a superimposed signal of both signals $S_1$ and $S_2$ might be received. If regenerative relaying is used, the data $D_1$ and $D_2$ are extracted, typically involving FEC-decoding and demodulation operations. If non-regenerative relaying is used, the relaying node $v_3$ does not extract the data from the signals, however, scaling and possibly also phase rotation operations may be performed.

215: The relaying node $v_3$, forms a reduced representation $S_r$ by the use of a non-linear encoding operation. The non-linear encoding operation may be performed on the first and second signals, or a superimposed signal, for example if non-regenerative relaying is used. Alternatively, the non-linear encoding operation is performed as a bitwise operation on the first and second data $D_1$ and $D_2$ comprised in the signals. The reduced representation may be further processed, for example amended with CRC and FEC, and provided with a header prior to transmission.

220: The relaying node $v_3$, transmit the reduced representation to the first node $v_1$, and to the second node $v_2$.

225: The first node $v_1$, performs a non-linear decoding operation of the reduced representation with the use of its a priori known information, which comprises a representation of $D_1$, to extract $D_2$. The second node $v_2$ performs a non-linear decoding operation of the reduced representation with the use of its a priori known information, which comprises a representation of $D_2$, to extract $D_1$.

Depending on if its is preferable to let the non-linear encoding operation operate on a signal level or on data packet level the implementation of the non-linear operation will differ, which is exemplified in the below described example embodiments.

The operation according to the above described steps is applicable in both a 3-phase and a 2-phase protocol.

In the 3-phase scenario information is received by the relaying node $v_3$ in consecutive order from the first node $v_1$ and the second node $v_2$. This is in FIG. 3 illustrated with solid arrows $D_1$ and $D_2$. Hence, the flowchart described with reference to FIG. 2 may be amended according to:

205:1 The first node $v_1$, transmit a first signal $S_1$ comprising first data $D_1$ designated for the second node $v_2$, via the relaying node $v_3$, The first node $v_1$ stores the transmitted data $D_1$, the signal $S_1$, or a representations thereof, as at least a part of its a priori known information.

210:1 The relaying node $v_3$, receives the first signal $S_1$ and stores the signal, the data $D_1$ or a representation thereof.

205:2 The second node $v_2$, transmit a second signal $S_2$ comprising the second data $D_2$ designated for the first node $v_1$, via the third node $v_3$. The second node $v_2$ stores the transmitted data $D_2$, the signal $S_2$, or a representation thereof, as at least a part of its a priori known information.

210:2 The relaying node $v_3$, receives the second signal $S_2$ and stores the signal or the data $D_2$ or a representation thereof.

Figure 3:
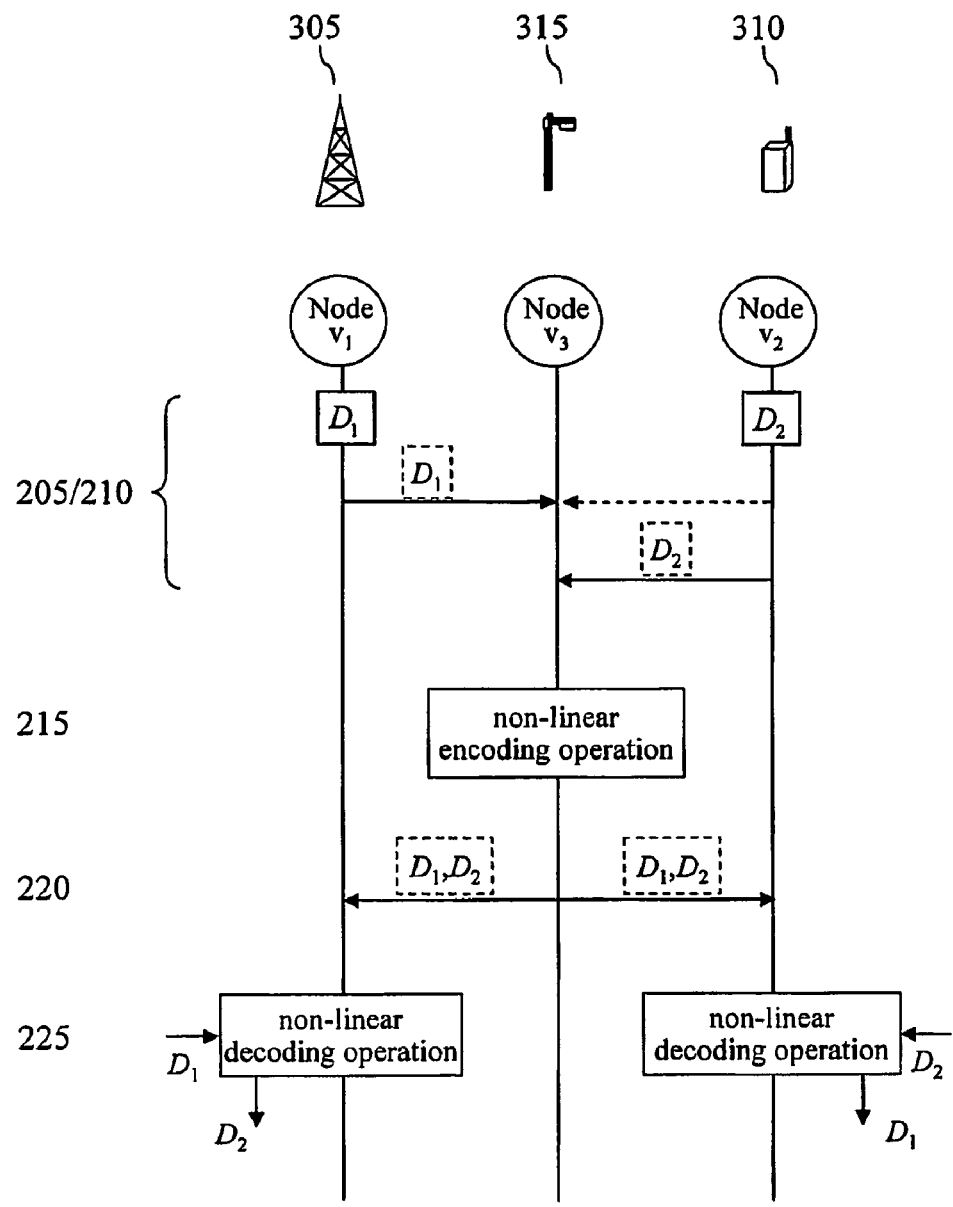
FIG. 3 is a schematic illustration of the transmission sequences in a communication system.

In a 2-phase scenario, illustrated by the dashed arrow in FIG. 3, information is received concurrently from the first node $v_1$ and the second node $v_2$. This may be achieved for example through frequency division multiplexing or by that the same channel is used. In the former case, the relay node can, in the receiving step 210, easily separate the receptions, whereas in the latter case, separation is more complex. One method, known in the art, is to use Multi-user Detection. A further alternative is to avoid separating the signals altogether. If no separation is performed, then the non-linear encoding operation, step 215, must be designed to cater for handling a superposition of the two signals for example by using a modulus based operation (a suitable modulus operation will be described in detail below). In any case, both the first node $v_1$ and the second node $v_2$ exploit a priori information of what has been sent to decode the information that is received from the relay node.

The a priori known information may preferably comprise the data ($D_1$ and $D_2$) generated at respective node, information that may be described as "own generated". Alternatively, or in combination, the a priori known information may comprise "received-and-forwarded information" as well as "overheard information". The former being data that a node, for example being part in a multihop chain, has received for further forwarding towards the designated node of that data. The latter being data designated to one node, but which another node was able to receive and decode. Whatever origin, the a priori known information is stored by a node for possible later usage in decoding a received data packet. Note that, e.g. in non-regenerative relaying, it may be practical to use the a priori known information in another form such as a modulated and FEC encoded baseband signal.

In an alternative embodiment a base station acts as the relaying node between two communicating mobiles.

The technology has, with references to FIGS. 2 and 3, been described in a three-node scenario, typically corresponding to a possible scenario in a cellular communication system. However, the technology is by no means limited to three-nodes, or two hop, schemes. On the contrary the technology described in this application will equally well function in multihop schemes, utilizing a plurality of relaying nodes as schematically illustrated for example in FIG. 4. The two end nodes, node $v_1$ and node $v_2$ are engaged in bidirectional traffic via the intermediate, relaying nodes $v_3$, $v_4$ and $v_5$. The transmissions from two nodes within specific steps are not necessarily concurrent. The steps of the method comprise:

405: Node $v_1$ transmit a first signal $S_1^{(1)}$ comprising first data $D_1^{(1)}$ and node $v_2$ a second signal $S_2^{(1)}$ comprising first data $D_2^{(1)}$.

410: The data $D_1^{(1)}$ and $D_2^{(1)}$, or the signals $S_1^{(1)}$ and $S_2^{(1)}$ comprising data $D_1^{(1)}$ and $D_2^{(1)}$ are received and stored (as their respective a priori information) by nodes $v_3$ and $v_5$, respectively.

415: Nodes $v_3$ and $v_5$ forwards $D_1^{(1)}$ and $D_2^{(1)}$, or $S_1^{(1)}$ and $S_2^{(1)}$, respectively.

420: Node $v_4$ receives and stores the data $D_1^{(1)}$ and $D_2^{(1)}$ or the signals $S_1^{(1)}$ and $S_2^{(1)}$ comprising data $D_1^{(1)}$ and $D_2^{(1)}$.

425: Node $v_4$ forms a first reduced representation Sri by a non-linear encoding operation on the data $D_1^{(1)}$ and $D_2^{(1)}$ or on the signals $S_1^{(1)}$ and $S_2^{(1)}$ comprising data $D_1^{(1)}$ and $D_2^{(1)}$.

430: Node $v_4$ transmit the first reduced representation $S_{r1}$ to nodes $v_3$ and $v_5$.

435: Nodes $v_3$ and $v_5$ extract $D_2^{(1)}$ and $D_1^{(1)}$ or the signals, $S_2$ and $S_1$, comprising data $D_1^{(1)}$ and $D_2^{(1)}$, respectively, from the received reduced representation by the use of their respective a priori known information in a non-linear decoding operation.

440: Optionally the nodes $v_3$ and $v_5$ stores the extracted $D_2^{(1)}$ and $D_1^{(1)}$ or the signals, $S_2$ and $S_1$ for further usage.

445: The data packets $D_2^{(1)}$ and $D_1^{(1)}$ are forwarded towards their respective end nodes $v_1$ and $v_2$. Alternatively the reduced representation Sri is forwarded without decoding, i.e. non-regenerative relaying.

If more data packets are sent from the end nodes $v_1$ and $v_2$ in the bidirectional traffic scenario, the principles disclosed herein may be utilized to further enhance the communication. In this embodiment step 445 is replaced with steps 450-470:

450: Node $v_1$ transmit a further first signal $S_1^{(2)}$ comprising further first data $D_1^{(2)}$ and node $v_2$ transmit a further second signal $S_2^{(2)}$ comprising further second data $D_2^{(2)}$ and representation of data is stored (as their respective a priori information) by respective node.

455: The signals are received and the signals $S_1^{(2)}$ and $S_2^{(2)}$, or the data $D_1^{(2)}$ and $D_2^{(2)}$, are stored by nodes $v_3$ and $v_5$, respectively.

460: Node $v_3$ forms a second reduced representation $S_{r2}$ by a non-linear encoding operation on the data $D_1^{(2)}$ and $D_2^{(1)}$ or on the signals $S_1^{(2)}$ and $S_2^{(1)}$. Node $v_5$ forms a third reduced representation $S_{r3}$ by a non-linear encoding operation on the data $D_1^{(1)}$ and $D_2^{(2)}$ or on the signals $S_1^{(1)}$ and $S_2^{(2)}$.

465: Node $v_3$ transmit the second reduced representation $S_{r2}$ to nodes $v_1$ and $v_4$. Node $v_5$ transmit the third reduced representation $S_{r3}$ to nodes $v_2$ and $v_4$.

470: Nodes $v_1$ and $v_2$ extract $D_2^{(1)}$ and $D_1^{(1)}$, or signals $S_2^{(1)}$ and $S_1^{(1)}$, from the second and third reduced representations, $S_{r2}$ and $S_{r3}$, respectively, by the use of a non-linear decoding operation and their respective stored a priori information, data $D_1^{(2)}$ and $D_2^{(2)}$, or signals $S_1^{(1)}$ and $S_2^{(2)}$. Node $v_4$ utilize the third and second reduced representations and it's a priori information $D_2^{(1)}$ and $D_1^{(1)}$ to forward $D_1^{(2)}$ and $D_2^{(2)}$, or $S_1^{(2)}$ and $S_2^{(2)}$ in respective directions, either in separate transmissions, or as in new reduced representations.

The above scheme may, as appreciated by the skilled in the art, be extended to a larger number of intermediate nodes and more data packets. The transmissions in step 415 and 450, for example, has in the figure, for reasons of clarity, been illustrated as concurrent. In similarity with the previously described embodiment with one relaying node, these transmissions can be consecutive or concurrent. In multihop scenarios, especially if even more nodes are involved than the above exemplified, various alternatives will arise in how data packets or signals can be combined into composite packets. With regards to the exact combination of data packets/signals the described multihop procedure should be regarded as a non-limiting example.

The performance of this bi-directional multihop method can increase the throughput with up to a factor of two, relative to traditional multihop schemes, without increasing the power or energy expense.

Figure 4:
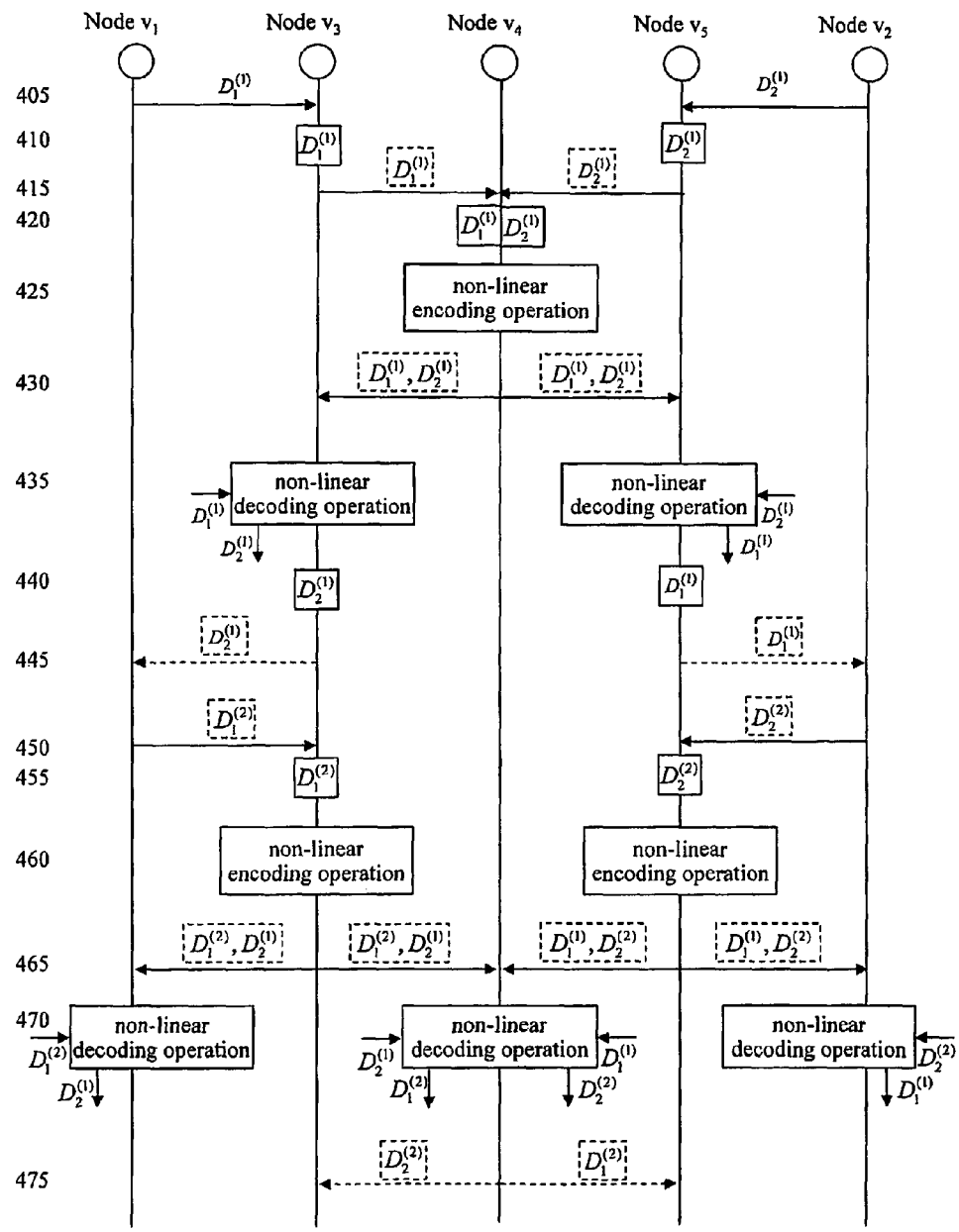
FIG. 4 is a schematic illustration of the transmission sequences in a multihop system according to one example embodiment.

The non-linear encoding operation in the relaying nodes and the non-linear decoding operation in the receiving nodes, as described with references to FIGS. 2, 3 and 4, can be performed in several ways, representing different embodiments. The illustrative embodiments will for simplicity primarily be described in a three-node scenario as described with references to FIG. 3. However, the embodiments are generally not limited to three-nodes, or two hop, schemes and will equally well function in multihop schemes, utilizing a plurality of relaying nodes.

Examples of high level aspects that may influence how the non-linear encoding is performed includes, but is not limited to the following:

Concurrent/Consecutive Reception (at the Relay) from Node $v_1$ and $v_2$.

As described above, signals may be concurrently received or received consecutively by the relaying node $v_3$. Consecutive reception is easy to separate and encode individually. Concurrently received signals may be separated by a multi-user detector, and treated separately at the encoding, or the concurrently received signals may be encoded jointly. Distinctions could also be made based on multiplexing in the frequency or time domain. Apart from MUD based separation, any orthogonally coded sequences are straightforward to separate.

The Non-Linear Encoding Operates on FEC Decoded/Undecoded Data.

The non-linear encoding may operate on signals of different formats. For instance, the received signals may have been demodulated and FEC (Forward Error Correction) decoded or remain (non-demodulated and FEC) undecoded. The undecoded information is typically a complex baseband signal. To get the undecoded signal in a desired form, linear processing, e.g. scalings, phase-rotations, Discrete or Fast Fourier Transforms etc, may need to be performed on the base-band or the RF signal.

The Non-Linear Encoding Operates on Hard or Soft Bits.

FEC decoders can generally offer hard or soft bits. If the data packets received from node $v_1$ and node $v_2$ are FEC decoded the non-linear decoding need to be adjusted accordingly. A non-linear encoding considering soft bits will generally be more elaborate than handling hard bits. However, if the hard bits are erroneous, performance will be affected adversely.

The Non-Linear Encoding Operates on Subvectors of Desirable Size.

Vectors of complex symbols or bits are received from node $v_1$ and node $v_2$. A vector may be partitioned in one or more subvectors on which the non-linear encoding (and subsequent decoding) is performed. The extreme case is that the subvector only contains a single element, i.e. the subvector becomes a scalar.

Support of Cooperative/Traditional Relaying.

In traditional relaying a single relay forwards data and other signal paths are not exploited. In cooperative relaying, signals corresponding to a data packet may take not just one but multiple paths. For instance, node $v_2$ sends a signal directly to node $v_1$, but the signal is also forwarded over a relaying node $v_3$, which enables a new combining approach in a receiving end node. Another cooperative relaying solution uses multiple relays that forward the same data. Various methods for coding for combining as well as the process for combining may be adopted. The term "combining" should in this application be given a broad interpretation and is meant to encompass all processes wherein data or a signal associated with one signal path is used to enhance the data/signal of another path. Note that the format, such as encoding of the signal may be different over the different paths. The intention with cooperative relaying is to achieve one or more of the following objectives; introducing diversity (provides robustness and operation at lower signal to noise ratio), directivity (provides improved signal to noise ratio) or spatial multiplexing gains (provides increased spectrum efficiency). Aspects of incremental redundancy may be a part of cooperative relaying FEC Encoding Performed after/Before Non-Linear Encoding of Data Packets.

FEC encoding may preferably be performed on the jointly non-linearly encoded data, the composite data packet. Alternatively, the FEC encoding may be performed individually on each data packet, e.g. on individual data packets $D_1$ and $D_2$, prior to the non-linear encoding.

A plurality of implementation examples, addressing the above exemplified conditions will be presented. It should be noted that in the figures accompanying the description communication links are schematically illustrated to communicate via baseband. In reality signals are transposed up to radio frequency at a transmitter and transposed back to baseband at a receiver. Also, the receivers and transmitters may perform various linear operations that are commonly used, such as amplification, phase adjustment, fast Fourier transforms etc.

Regenerative Relaying (with Hard Bits Input to Encoding)

Figure 5A:
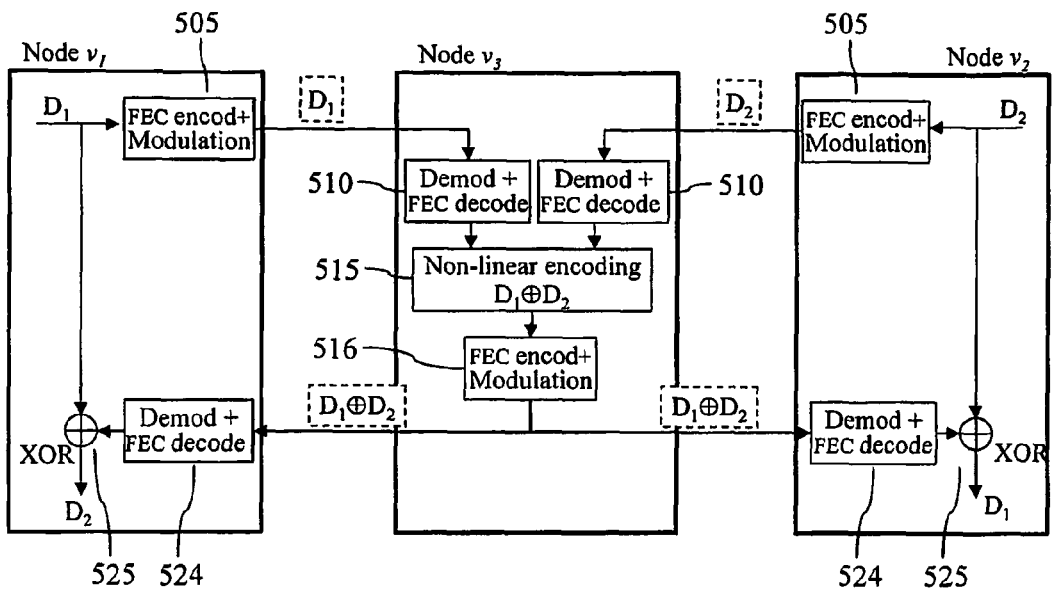
FIG. 5a-e are a schematic illustration of the operation sequences according to different example embodiments.

In a first implementation example, representing one example embodiment, three nodes, $v_1$, $v_2$, and relaying node $v_3$, are involved in the communication, as schematically illustrated in FIG. 5a. Regenerative relaying is utilized, characterized in that the relaying node $v_3$ decodes its received signals and extract the data packets carried by the signals. In a prior art relaying scenario, FIG. 1, the procedure would be to transmit a data packet $D_1$ from $v_1$ to $v_3$ to $v_2$, and then a data packet $D_2$ from $v_2$ to $v_3$ to $v_1$. As described with references to FIGS. 2 and 3, node $v_1$ transmit a first data packet $D_1$ to $v_3$ and $v_2$ transmit second data packet $D_2$ to $v_3$. Relaying node $v_3$ then forms a reduced representation by jointly encoding both data packets into one composite data packet $f(D_1, D_2) \rightarrow D_3^{(coded)}$ prior to transmitting it concurrently to both $v_1$ and $v_2$. According to the embodiment the encoding is a bitwise operation, preferably a bitwise XOR, i.e. $D_3^{(coded)} = D_1 \oplus D_2$. Thus, node $v_1$ can decode the data from node $v_2$ by the operation $D_1 \oplus D_3^{(coded)} \Rightarrow D_2$ and similarly node $v_2$ decodes the data from node $v_1$ by the operation $D_2 \oplus D_3^{(coded)} \Rightarrow D_1$. Hence, instead of two transmissions from node $v_3$, only one transmission is used, but the same amount of data is transferred with the same energy expenditure as for one (the worst) transmission.

The non-linear encoding, e.g. XORing, may take place on different levels. Either it may be on a payload data level with a subsequent common FEC encoding of the composite data packet. This alternative has the advantage of not adding any extra complexity to the receiving nodes ($v_1$ and $v_2$). Alternatively, data packets $D_1$ and $D_2$ are first FEC encoded and then XORed. This requires a more complex receiver as the non-linear encoding must be undone before or taken into account in the FEC decoding process.

In the implementation illustrated in FIG. 5a. The data packets $D_1$ and $D_2$ are subjected to FEC and modulation 505 prior to the transmission from nodes $v_1$ and $v_2$, respectively. The relaying node $v_3$ performs a demodulation and decoding (FEC-decoding) 510 of the received signals, separately, to extract the data packets $D_1$ and $D_2$. The non-linear encoding operation, comprises a bitwise XOR operation, $D_3^{(coded)} = D_1 \oplus D_2$, 515 to form the composite data packet, i.e. the reduced representation. If packets lengths differ, the shorter packet is padded with a known sequence, e.g. an all-zero sequence. Prior to transmission additional coding, FEC, and modulation 516 is performed. Upon reception of the composite data packet, the nodes $v_1$ and $v_2$ performs demodulation and FEC-decoding 524 and subsequent the non-linear decoding operation 525 using the stored prior art information to extract $D_2$ and $D_1$ respectively.

Figure 5B:
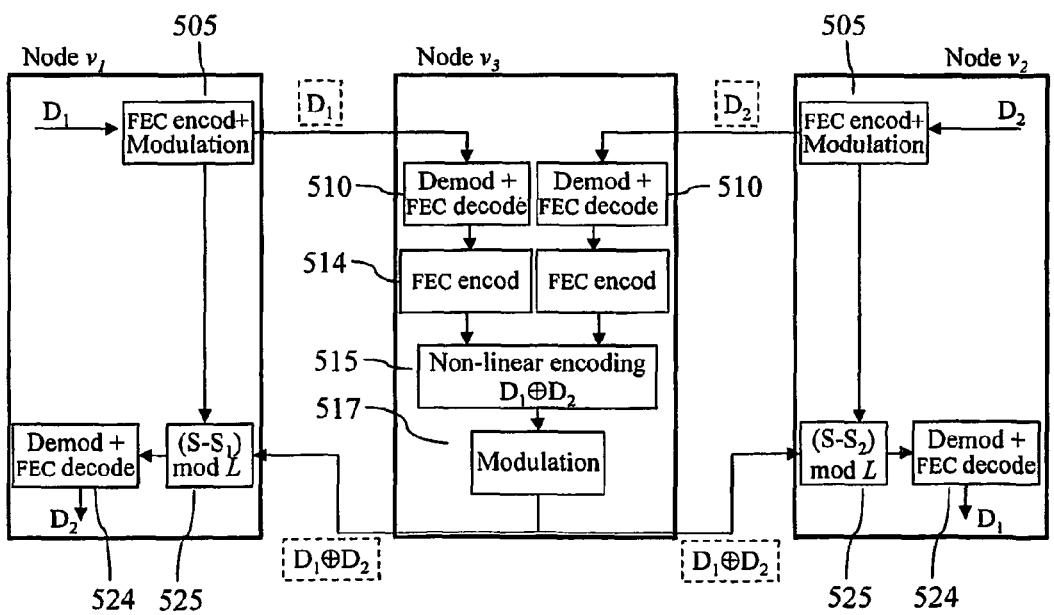

Alternatively, as illustrated in FIG. 5b, the relaying node performs the FEC encoding 514 on the data packets $D_2$ and $D_1$ separately, prior to the non-linear encoding 515. The composite data packet is then modulated 517. Upon recepton of the composite data packet, the nodes $v_1$ and $v_2$ firstly performs non-linear decoding operation 525, followed by the demodulation and a FEC-decoding 524 to extract $D_2$ and $D_1$ respectively.

The method for encoding is preferably based on XOR bitwise encoding, due to its simplicity, but other codes, with the desired invertability, i.e. the desired data sequence can be extracted from the composite packet by means of the a priori known data sequence may also be used such as an erasure code, e.g. Reed Solomon. The same operation as the non-linear encoding XOR operation between two words is for instance possible if one selects a shortened RS code with K=2 (each data word, i.e. $D_1$ and $D_2$ are considered to be the systematic words) with N=3 codewords.

Figure 6A:
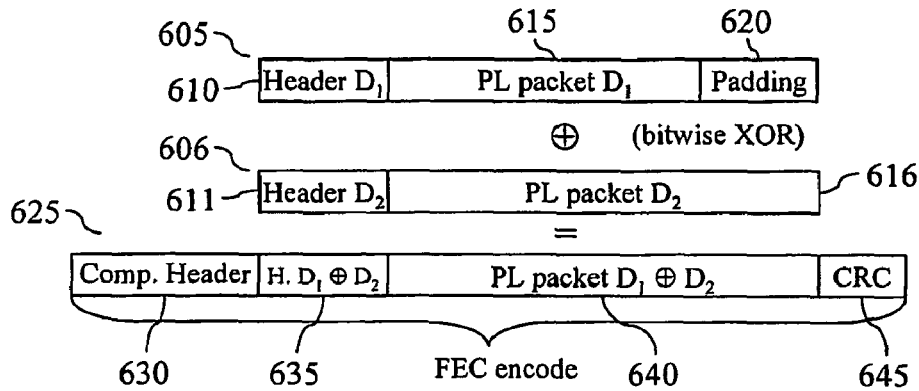
FIG. 6 a-c are schematic illustrations of the encoding principles according to different example embodiment.

An example of possible code-frame formats is shown in FIG. 6a, where the data packets from two nodes are jointly non-linearly encoded in the relaying node. The data packets $D_1$ 605 and $D_2$, 606 comprises of payload portions 615, 616 and headers 610, 611. The composite data packet 624 formed by the non-linear encoding comprises a payload portion 640 and an encoded header 635. If the data packets $D_1$ and $D_2$ are of different length, it might be necessary, or preferable, to add padding bits to the shorter packet to make them equal in length. Alternatively the shorter data packet is extended by repetition coding or replaced with a FEC coded version of the data packet of close to, or equal to, the same length of the longer packet. This is in the figure exemplified with the padding portion 620 added to data packet $D_1$. The format represents the bitwise XOR encoding method, e.g. depicted in FIG. 5a-b. Note that, in this example, it is possible, and preferred, to replace the individual CRCs on packet $D_1$ and $D_2$ seen at reception at the relaying node, with a common CRC 645 over the composite packet 624. Also, it may be preferable to include an extra header 630 appended by the relaying node indicating characteristics of the relayed non-linearly encoded packet. For instance, the composite header indicates if one or two packets are sent (if packet $D_1$ was in error, only the correct packet $D_2$ may be sent). In some instances it may be useful to indicate which packet is forwarded, if only one is decoded correctly and it is decided to not encode any erroneous packet with the other. An indication of the length of the shortest packet, if packets are of unequal length, and which is the shortest, may be added. In short, necessary position and/or length of packet $D_1$ and $D_2$ in the composite packet is included to allow the receiver to extract the desired packet. If one of the packets $D_1$ and $D_2$ are in error, it may still be preferable to non-linearly encode the packets. However, as the same error pattern will result after the XOR-decoding at respective receiver, it is possible to take some precautions avoiding this result or the effect of it. For example, to indicate which packet was not correctly received at the relaying node. This does not solve the error replication problem, but at least make the receiver aware of the issue. Various strategies of appending FEC and parity based on the correctly decoded packet in the relay could be adopted.

FIG. 6a illustrates one possible frame format; many other formats can be envisioned. For instance, headers may not be used in circuit switched communication. Headers from packet $D_1$ and $D_2$ could be modified in the relaying node into a single joint header etc.

Non-Regenerative Relaying (with Baseband Input to Encoding)

Figure 5C:
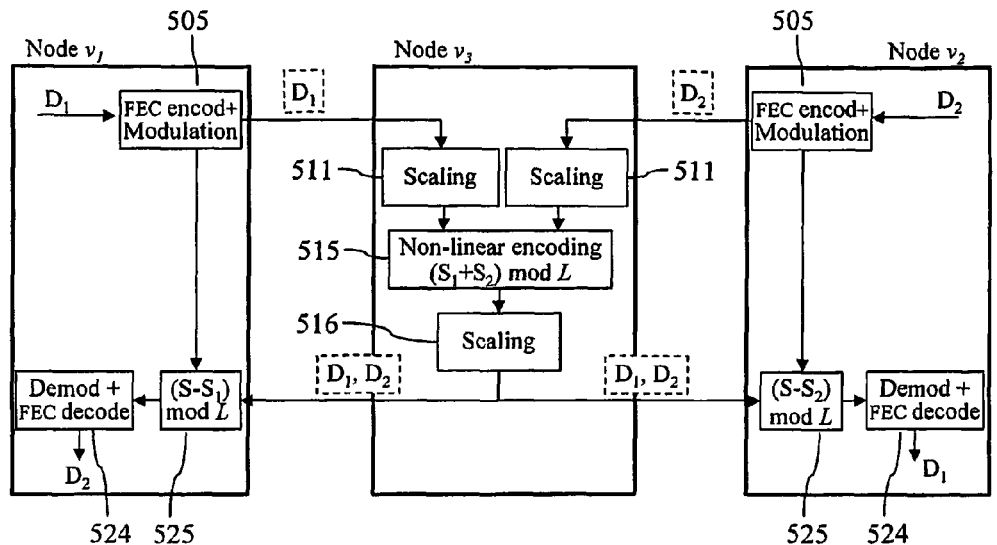
Figure 5D:
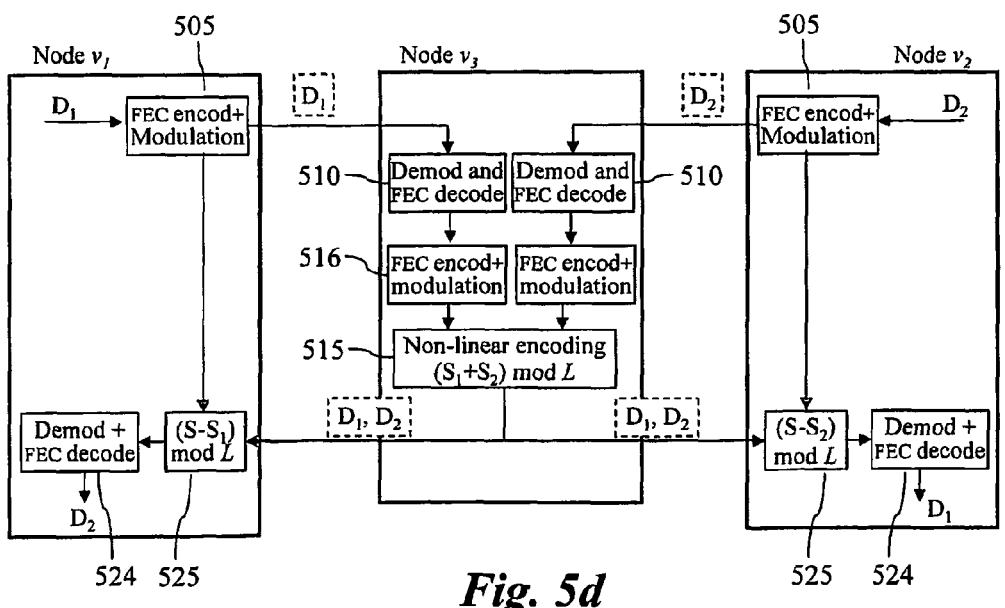
Figure 5E:
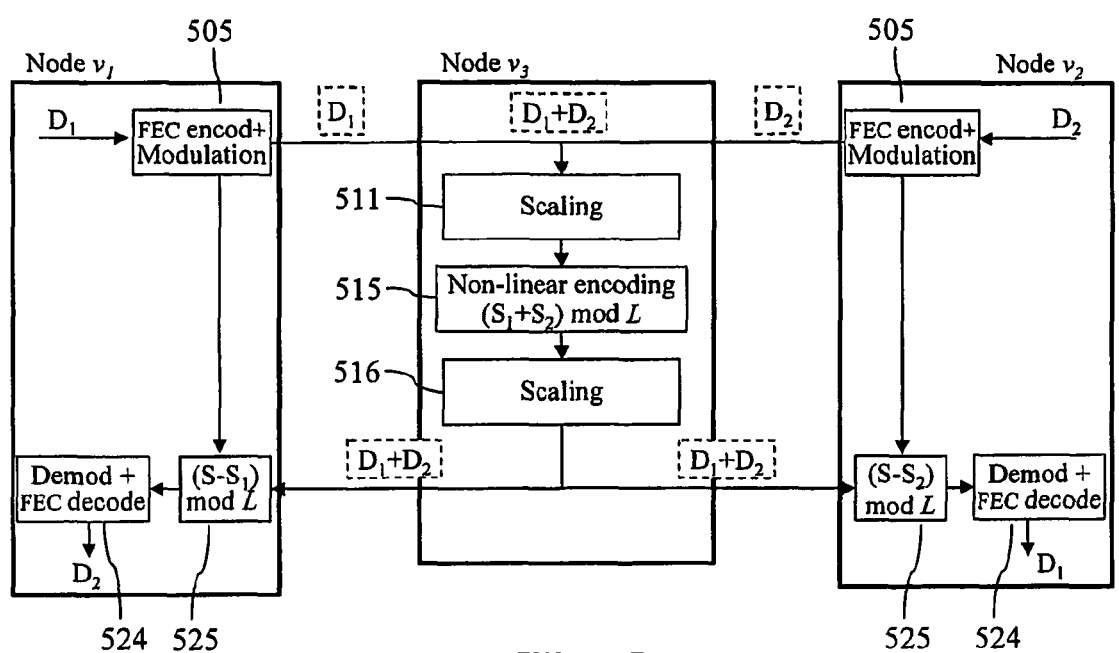

It may be desirable to minimize the signal processing in a relaying node, e.g. not to perform FEC decoding in the relaying node, e.g. due to potential delays or increased complexity. If so, the technology described in this application may be implemented as a non-regenerative relaying with non-linear encoding on a baseband signal, which is schematically illustrated in FIG. 5c-e. It is, as an illustrating example, assumed that the air-interface uses OFDM. However, when delay spread is non-significant, i.e. not causing any significant inter symbol interference, it is also possible to use the process illustrated in FIG. 5c-e for a single carrier based modulation. In the OFDM case, the non-linear encoding in the relay operates per subcarrier symbol. The non-linear encoded signal is converted to a time domain signal over the air-interface, and at the receiver operation is again performed on a per subcarrier symbol. In FIG. 5c-e terms relating to channel characteristics and noise contributions are omitted in the schematic illustrations, for the reason of clarity. As apparent for the skilled in the art, a transmitted signal will always be subjected to influence by the channel as well as noise, and known measure can be taken to account for these factors.

The non-linear encoding/decoding operations are in this embodiment based on the modulus operator, defined as in "dirty paper coding" and "lattice decoders", wherein the modulus operation is performed for the real and imaginary parts independently when handling complex numbers, and on the mathematical fact that $$((S_1+S_2) \bmod L - S_2) \bmod L = (S_1) \bmod L,$$

which indicates that a signal $S_1$ can be superimposed on a signal $S_2$ and allow undisturbed recovery of the signal $S_1$, as long as the signal $S_1$ does not exceed the quantization level L, while the amplitude, and hence the power, is limited of the superimposed (non-linearly encoded) signal. The receiver will obviously need to tune the complex gain at the receiver for cancellation of $S_2$, i.e. catering for the complex channel gain between the relay and the receiving node. The scaling of the received signal at the relay is to ensure that $S_1$ and $S_2$ are roughly of the same magnitude and potentially also having respective In-phase and Quadrature phase axis aligned.

The non-linear encoding may be scalar or vector oriented. The higher dimensionality of the input signal, i.e. a complex vector, to the non-linear encoding, which is the case for Vector quantizers, the better compression performance is generally achieved. However, in contrast to classical Vector quantization, it is not the index to the centre of the region that the vector points towards that is transferred by the relay, but rather the remainder, i.e. the difference between the actual vector and the centre of the domain.

Other types of pre-processing schemes of the received signals prior to the non-linear encoding in the relaying node may be used in combination with the method.

In the non-generative implementation illustrated in FIG. 5c, and with references to the basic flowchart of FIG. 2, the data packets $D_1$ and $D_2$ are subjected to FEC and modulation 505 in the transmission from nodes $v_1$ and $v_2$, respectively. The relaying node $v_3$ performs scaling (and possibly also phase rotation) operations 511 in the receiving step 210 on the received signal $S_1=g(D_1)$, and $S_2=g(D_2)$. The non-linear encoding, performed on the received signals, $(S_1+S_2) \bmod L$, 515 forms the reduced representation of the received signals $S_3=f(D_1, D_2)$. An additional scaling 516 may be performed prior to transmission. Upon reception of the composite signal, the nodes $v_1$ and $v_2$ performs non-linear decoding $(S_3+n_1-S_1) \bmod L$, and $(S_3+n_2-S_2) \bmod L$, respectively 525. In the foregoing equations, $n_1$ and $n_2$ are the equalized receiver and interference noise. Demodulation and FEC-decoding 526 makes it possible to extract $D_2$ and $D_1$ respectively. In the foregoing example it has been assumed that the nodes applies equalization to the incoming signals prior to the non-linear encoding/decoding to account for the complex channel attenuations. An alternative is to use the non-equalized signals $S_1$ and $S_2$ in the non-linear encoding/decoding operations. In this case estimates of the complex channel attenuations will have to be introduced in the encoding/decoding operations.

Various combinations of the schemes described with references to FIG. 5a-c may be envisaged. In a further embodiment, schematically illustrated in FIG. 5d the relaying node $v_3$ utilizes regenerative relaying. The signals $S_1$ and $S_2$ from nodes $v_1$ and $v_2$, respectively, are demodulated and FEC-decoded 510 to retrieve data packets $D_1$ and $D_2$. The FEC encoding and modulation 516 is in this embodiment performed prior to the non-linear encoding operation 515 performed on the signals $S_1$ and $S_2$.

In the scenario schematically illustrated in FIG. 5e, two concurrently received signals $S_1$ and $S_2$ are superimposed in the same channel when received. After scaling/phase rotation operations 511 the superimposed signal is non-linearly encoded 515. An additional scaling 516 may be performed prior to transmission. The procedure of extracting the data $D_2$ and $D_1$ in nodes $v_1$ and $v_2$, respectively, will correspond to the procedure described with reference to FIG. 5c.

Figure 6B:
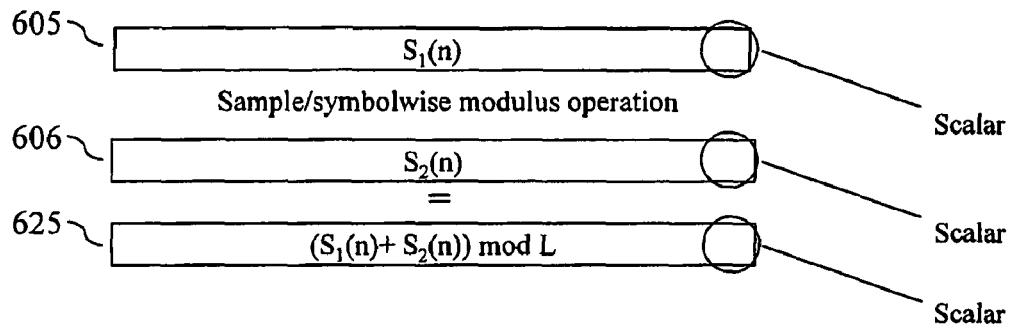

Possible formats for the composite signal suitable for the non-linearly encoded operation described with reference to FIG. 5c-e are illustrated in FIG. 6 b-c. In the format illustrated in FIG. 6b are the signals $S_1$ 605, and $S_2$ 606 symbolwise or sample wise (both typically complex valued) non-linearly encoded with the modulus operation to form the composite signal 625.

Figure 6C:
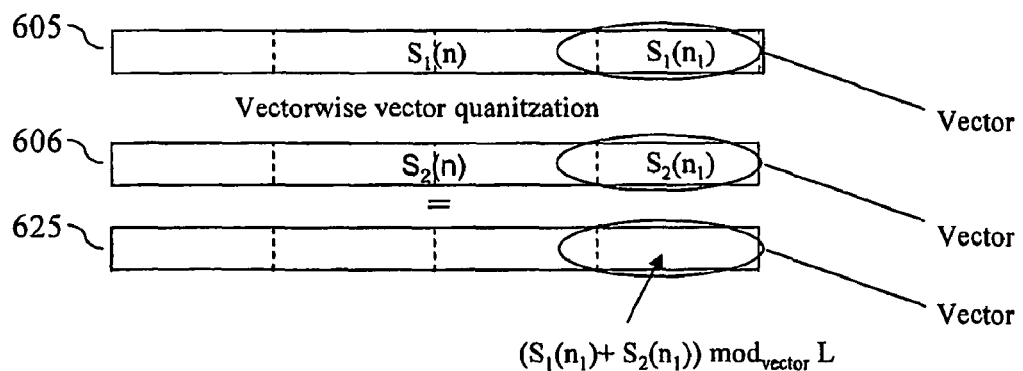

An alternative format for the non-linearly encoded signal is schematically illustrated in FIG. 6c. In this case, the signal vector is divided into a set of subvectors. Each subvector is vector quantisized. It should be noted that the full signal vector can also be considered for vector quantization also rather than a multitude of subvectors. It should be further noted that the scalar case in FIG. 6b can be seen as a special case of the vector case in FIG. 6c. Operating on vectors allows reduced transmit power/energy of the relay with sustained communication quality, or increased quality at the same power/energy investment.

Relaying with Combining

It may be desirable to enhance the reception by exploiting direct signal between the nodes $v_1$ and $v_2$, as well as the reduced representation formed in the relaying node $v_3$. The direct signal or signals can be seen, and will be referred to, as signals or data in an unreduced form. At least two methods are envisioned. One is to use a form of incremental redundancy, and another a form of chase combining. This offers diversity gain, and for the incremental redundancy variant also coding gain. In the embodiments combining, it is assumed that the regenerative and bit-wise XOR based system as described with reference to FIG. 5a-b is used. Moreover, while the combining between a composite packet and a direct signal is described for a three node scenario, a sending node, a relay encoding the composite packet, and a receiver performing the combining operation, the same principle could be used for more nodes, e.g. when more than three nodes forms a chain of nodes for bi-directional traffic.

Figure 7:
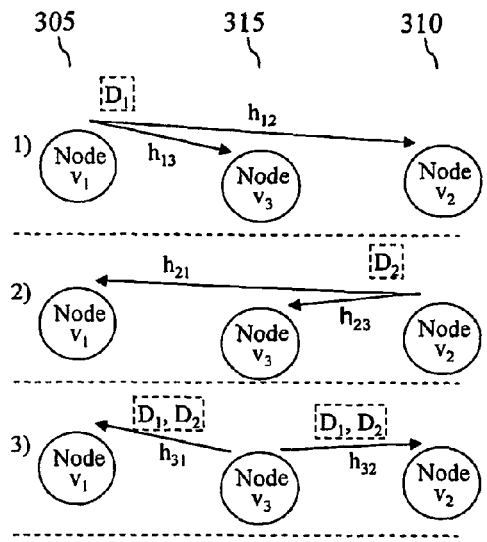
FIG. 7 is a schematic illustration of the transmission sequences according to one example embodiment utilizing combining.

The principle of relaying with combining is outlined in FIG. 7. The nodes $v_1$ and $v_2$ transmit data packets $D_1$ and $D_2$, in step 1 and 2 respectively. The relaying node $v_3$ forms a composite data packet $D_3$ by jointly non-linear coding of $D_1$ and $D_2$. The composite data packet $D_3$ is transmitted to nodes $v_1$ and $v_2$, in step 3. $D_1$ is transmitted over the complex channels $h_{13}$ to the relay $v_3$ and the "direct" complex channel $h_{12}$ to $v_2$. $D_2$ is transmitted over the complex channels $h_{23}$ to the relay $v_3$ and the "direct" complex channel $h_{21}$ to $v_1$, respectively and $D_3$ over the complex channels $h_{31}$ and $h_{32}$ to nodes $v_1$ and $v_2$, respectively.

Figure 8:
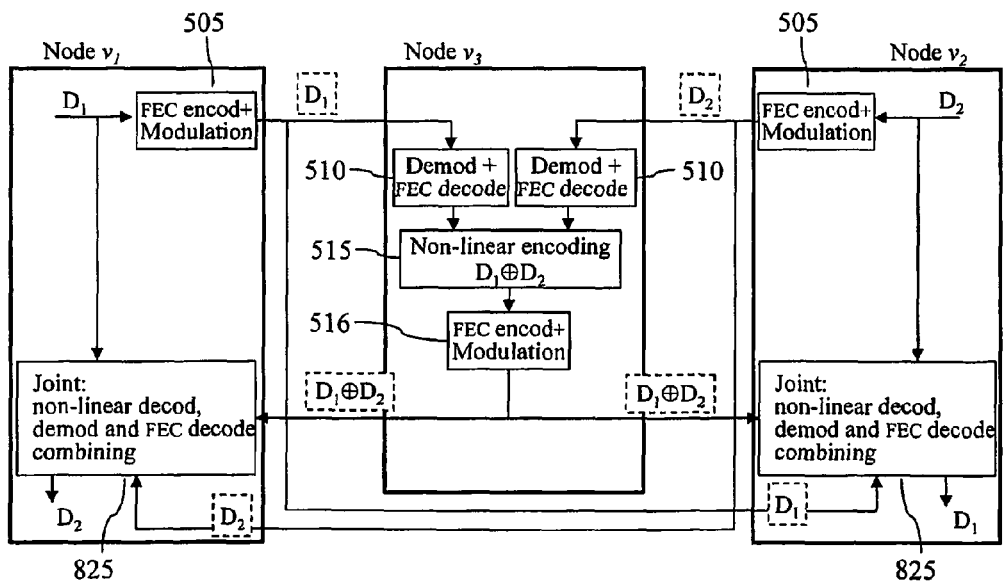
FIG. 8 is a schematic illustration of the operation sequences according to one example embodiment utilizing combining.

A method for the combination of non-linear encoding and combining, corresponding to the method as outlined with reference to FIG. 5a-b, is schematically illustrated in FIG. 8. The non-linear decoding 525 and demodulation/FEC decoding 524 of FIG. 5, may be seen as replaced with a joint non-linear decoding, demodulation/FEC decoding and combining operation 825. Inputs to the joint non-linear decoding, demodulation/FEC decoding and combining operation 825 in the receiving node $v_1$ are the signal representing the composite data packet, the directly received signal representing $D_2$, and the a priori known $D_1$, and the output is $D_2$. Correspondingly, inputs to the joint non-linear decoding, demodulation/

FEC decoding and combining operation 825 in the receiving node $v_2$ are the composite data packet, the directly received signal representing $D_1$, and the a priori known $D_2$, to produce the output $D_1$.

Regenerative Relaying (with Hard Bits Input to Encoding) and Incremental Redundancy:

An encoding scheme, following the basic scheme outlined with reference to FIG. 8, utilising incremental redundancy and with hard bits input to the regenerative encoding may comprise the use of at least two different codewords FEC1 and FEC2. The data packets $D_1$ and $D_2$, from nodes $v_1$ and $v_2$, are encoded with a Forward Error Correction (FEC) coding scheme that produces a codeword FEC1, whereas in the transmission of the composite data packet $D_3$ from the relaying node $v_3$ another codeword FEC2 is used. Here, FEC1 is a codeword that allows recovery of the original data packet in the relaying node $v_3$. One way to generate FEC1 and FEC2 is to use invertible FEC codewords. Another method is to generate the same low-rate codeword in both the sending node as well as the relaying node and punctuate this codeword differently to produce codewords FEC1 and FEC2. The FEC coding methods may include but are not limited to convolutional codes, algebraic codes, block codes, Turbo codes, Low density parity codes. Many well known methods for creating incremental redundancy codewords may be used, and the technology described in this application is not limited to the examples given above. In the above, it is noted that since the receiver that perform the combining receives two packets that has been coded differently, each contain the same information, whereas the composite packet also contain the a priori known information. Since different FEC redundancy has been generated for the data that is received directly and for the data that is received via the relay, a coding gain is offered. In general, for a well designed FEC encoding scheme here, the performance will be higher than for the chase combining version, i.e. when the same FEC encoding scheme is used both for the direct transmission as well as in the relay.

Decoding and Combining Scheme 1:

In this description, we focus on data sent from $v_1$ to $v_2$. However, the same operation applies in the other direction. The receiving node $v_2$, will first receive a direct signal encoded with FEC1 from $v_1$ and then a second jointly non-linearly encoded signal from the relaying node $v_3$. The receiver then process the two received signals and exploit the a priori knowledge of the own sent signal. One method is to decode both received signals and generate soft bits. The soft bits from the relay node are compensated for by exploiting the a priori knowledge of the own sent signal. The resulting two streams, comprised of soft bits, can then be combined to improve the quality of each soft bit, with a subsequent hard bit decision.

Decoding and Combining Scheme 2:

An alternative is to use maximum likelihood decoding at the receiving nodes $v_1$ and $v_2$, although it could be of high complexity. As an example, node $v_1$ is regarded as a receiver having a priori knowledge of sequence $D_1(n)$. The receivers task is to search (estimate) which data sequence $\hat{D}_2(n)$ that were transmitted. (Note, the index n indicating bit-position is omitted in the following), e.g. $D_2(n)$ is abbreviated as $D_2$.

It is assumed that the receiver has received signals $r_2 = h_{21} f_1(D_2) + N_1^{(1)}$, (directly from $v_2$) and $r_3 = h_{31} f_2(D_2 \oplus D_1) + N_1^{(2)}$ (via the relaying node $v_3$), where $h_{ij}$ is the complex channel from node $v_i$ to $v_j$, N is the noise, and $f_i$ represent the mapping from a data sequence to a FEC codeword and modulation scheme i to a transmitted signal.

The data sequence $\hat{D}_2$ can be estimated through $$\hat{D}_2^{(Opt)} = \arg\left(\min_{\forall D_2} \|(r_2 - \hat{h}_{21} f_1(\hat{D}_2)) + (r_3 - \hat{h}_{31} f_2(\hat{D}_2 \oplus D_1))\|^2 \mid D_1\right),$$

A sequence $D_2$ is searched, while taking into account its coded and modulated form—e.g. through $f(\hat{D}_2)$, such that the scalar metric $\|(r_2 - \hat{h}_{21} f_1(\hat{D}_2)) + (r_3 - \hat{h}_{31} f_2(\hat{D}_2 \oplus D_1))\|^2$ is minimized. This metric corresponds to minimizing the amount of error energy. If the correct word $D_2$ is chosen, then the error energy will only be caused due to noise. This minimization is performed while taking into account that $D_1$ is a priori known. In the metric, estimations of the complex channels $\hat{h}_{ij}$ are used. However, as is well known, channel parameters can also be jointly estimated in maximum likelihood sequence estimators.

Regenerative Relaying (with Hard Bits Input to Encoding) and Chase Combining:

In the chase combining variant, the sending nodes $v_1$ and $v_2$, and the relay node $v_3$ uses the same FEC codewords FEC1. Node $v_1$ FEC encodes its transmitted information, while $v_3$ FEC encodes the composite packet. Various decoding methods may be used, e.g. those described above under the incremental redundancy method. However, another method is that the direct signal from $v_1$, the signal from the relay $v_3$, is then combined in $v_2$ after soft bits have been determined, e.g. Log-likelihood values. The value of the log likelihood ratio (LLR) of the composite packet is sign flipped by the a priori known sequence. The resulting two LLR are then summed together and FEC decoding takes place or a hard decision is taken.

Non-Regenerative Relaying (with Baseband Input to Encoding and Chase Combining:

As an alternative to the above, also non-regenerative relaying can be used in combination to combining. The relaying node $v_3$ is non-regenerative (i.e. not performing any FEC decoding or encoding in the relay). The composite signal received from the relaying node $v_3$ is non-linearly decoded as with 525 in FIG. 5c. Considering e.g. $v_2$, the resulting signal after 525 is combined with the direct signal $S_1$ (from $v_1$). Examples of combining include, but is not limited to, maximum ratio combining (MRC) and interference rejection combining (IRC). After the combining, the resulting signal is demodulated and FEC decoded.

Figure 9A:
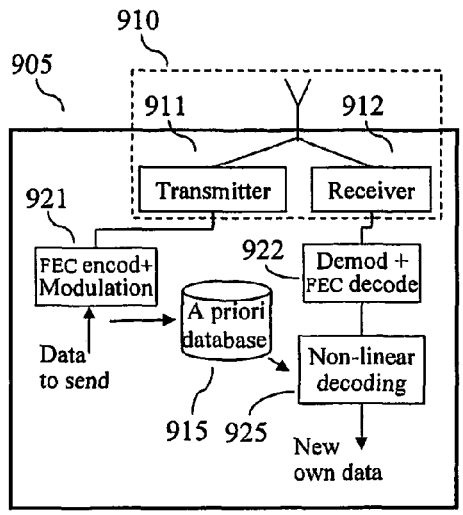
FIG. 9a-b are a schematic illustrations of two example embodiments of an end radio node.
Figure 9B:
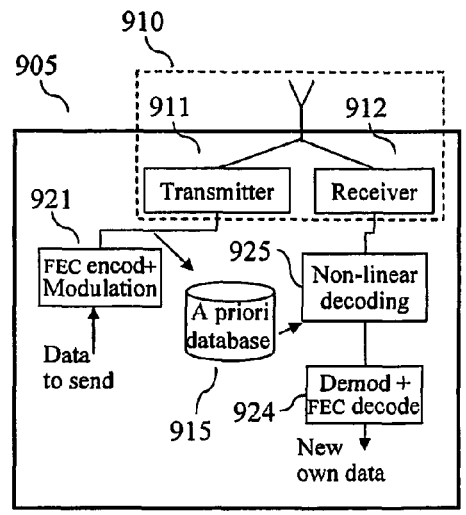

Arrangements in sending/receiving radio node ($v_1$ or $v_2$), and in a relaying node ($v_3$), suitable for effectuating the above described embodiments is schematically illustrated in FIGS. 9 and 10, respectively. The modules and blocks are to be regarded as functional parts of a node in a communication system, and not necessarily as physical objects by themselves. The modules and blocks are at least partly preferably implemented as software code means, to be adapted to effectuate the technology described in this application. The term "comprising" does primarily refer to a logical structure and the term "connected" should here be interpreted as links between functional parts and not necessarily physical connections. However, depending on the chosen implementation, certain modules may be realized as physically distinctive objects in a receiver or transmitter.

The radio node 905, illustrated in FIG. 9 a-b, comprises transmitting/receiving means 910, which provides the necessary functionalities for performing the actual transmission/reception. Suitable transmitting/receiving means are known to the skilled person. The transmitting/receiving means 910 comprises a transmission part 911 and a receiving part 912.

The transmitting part is connected to a modulation and FEC encoding module 921 for coding/modulation. The transmitting part 911 and the modulation and FEC encoding module 921 forms the transmitting chain of the radio node and is adapted to accommodate and process the data to be transmitted. The radio node 905 further comprises a storage module 915, or a priori database, wherein the a priori knowledge, for example sent data packets, are stored. The storage module 915 should be in connection with the transmission chain. In the case of the radio node being adapted for use in a system utilizing regenerative relaying, FIG. 9*a*, the receiving part 912 is firstly connected to a demodulation and FEC decoding module 922 and further to a Non-linear decoding module 925, forming a receiving chain that produces an output of new own data. In the case of non-regenerative relaying, FIG. 9*b*, the non-linear decoding module 925 is arranged before a demodulation and FEC decoding module 924, adapted to output new own data. The non-linear decoding module 925 is in connection to, and arranged to retrieve a priori information from, the storage module 915 for the decoding operation of a received reduced representation, i.e. a composite data packet (a) or a composite signal (b).

Figure 10A:
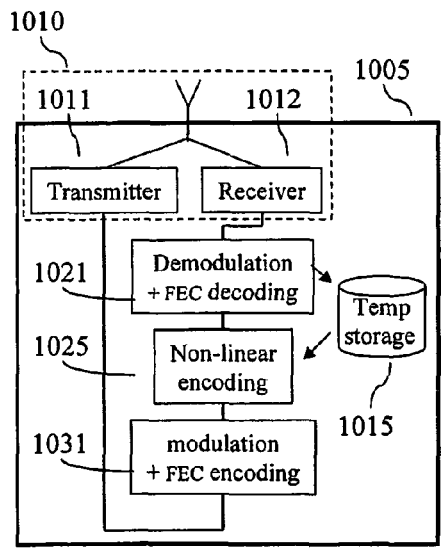
FIG. 10a-b are a schematic illustrations of two example embodiments of a relaying radio node.
Figure 10B:
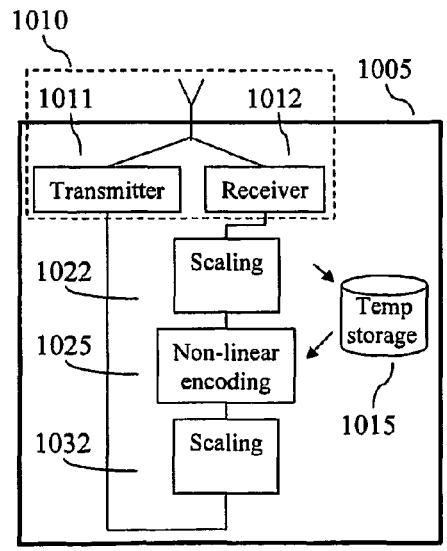

The relaying node 1005, illustrated in FIG. 10 *a*-*b*, comprises transmitting/receiving means 1010. The transmitting/receiving means 1010 comprises a transmission part 1011 and a receiving part 1012. The receiving part 1012 is part of a receiving chain also comprising means for signal processing. In the case of the relaying node being adapted for regenerative relaying, FIG. 10*a*, the receiving part 1012 is connected to a demodulation and FEC decoding module 1021, which in turn is connected to a Non-linear encoding module 1025. The non-linear encoding module 1025 is in connection with a modulation and FEC encoding module 1031 for forming the signal that is retransmitted by transmitter part 1011. In the case of non-regenerative relaying, FIG. 10*b*, the receiving part 1012 is connected to a first scaling module 1022, and further to the non-linear encoding module 1025, and possibly a second scaling module 1032.

The relaying node 1005 typically receives a first signal from a first node, e.g. signal $S_1$ from node $v_1$, at a first time instance and a second signal, e.g. signal $S_2$ from node $v_2$, at a second time instance. The first signal $S_1$, or data packet(s), $D_1$, comprised in that signal, is stored in a temporary storage module 1015, to be retrieved in the non-linear encoding operation with the second signal, performed by the non-linear encoding module 1025. Hence, the temporary storage module 1015 is in connection with the receiving chain and with the non-linear encoding module 1025.

In a multihop scenario, a relaying node is typically also a sending/receiving node, and the different functionalities of the node can be seen as different modes of operation. In this scenario the relaying node in addition comprises essentially all the parts, and is capable to perform all the functions of, the sending/receiving node for example the non-linear encoding module. As obvious for the skilled in the art functions/modules present in both the relaying node and the sending/receiving node does not need to be duplicated, rather modules such as FEC-encoding and modulation module and the transmitting/receiving means are preferably used in both modes of operation.

In a wireless network, it is likely that the path gains differ between involved destination nodes over time. Hence, there is a need to control power levels and data rates on the links. The power may be controlled to meet the quality requirement on the worst link. In the three node example power control loops could be applied over one or more permutation of nodes, i.e. there is a loop for the BS-RS, MS-RS and possible an End-to-End (ETE) loop ensuring sufficient ETE quality between BS and MS via RS. Also the loops may run in the other direction. Similarly, rate control may use one or more of the loops exemplified for power control. Power and rate may be controlled independently or in an integrated way.

The method and arrangement are not limited to user, or payload data. Any data, both user data and control data may be sent. ARQ acknowledgement messages, for example, may be non-linearly encoded together with a data packet. The technology described in this application does not discriminate between different types of traffic.

The size of packets sent from a relay is allowed to differ (if desired). One alternative is to always indicate the size of the shorter packet, which is straightforward in the embodiments of regenerative relaying. It is also possible to extend the shorter packet to match the size of the larger packet of the two. A possibility is that the shorter packet uses a repetition coding or other invertible coding to match the size of the greater packet. This information can be comprised in the header of the composite data packet or implicitly determined by the receiver knowing the size of the own a priori known packet and the packet received from the relaying node. A further possibility is to use padding appended to the shorter packet to make packets encoded into the composite packet of equal lengths.

A sending node may of course multiplex several data packets together into one data packet prior to transmitting it to the relaying node.

The method and arrangements may advantageously be used in a communication system in combination with other arrangements and methods far increasing throughput and/or reduce power, for example beamforming. The relaying node $v_3$, for example, could be equipped with beamforming means, with a first beam arranged towards node $v_1$ and a second towards node $v_2$ respectively. In essence a Spatial Division Multiplex Access (SDMA) solution. For the transmission of the composite signal/packet the relaying node transmit the same composite signal/packet in both the first and second beam.

The method and arrangement may also be used in conjunction with multiple antenna nodes. For example, MIMO based communication (spatial multiplexing) may be used between involved nodes. For instance, non-linear encoding may be performed per antenna layer at the relaying node with multiple antennas (spatial multiplexing), but a single layer space-time encoding over multiple antennas is indeed also possible.

The technology described in this application is not directly related to modulation schemes, and can hence be used for different modulation and multiplexing schemes, including but not limited to Orthogonal Frequency Division Multiplexing (OFDM), Orthogonal Frequency Division Multiple Access (OFDMA), Code Division Multiple Access (CDMA), etc. In principle, different modulation, multiplexing, FEC coding, advanced Antenna techniques (e.g. MIMO-spatial multiplexing, transmit diversity, and regular SISO communication) schemes can be used towards the relaying node.

The method and arrangement can be used in different types of networks including various forms of relaying like operations. Multihop networks have been mentioned earlier, but also networks using cooperative relaying with multiple parallel relays would benefit from employing the method and arrangements. Cooperative relaying with multiple parallel relays may be used to increase diversity, directivity or spatial multiplexing gain.

It is to be understood that the claims are not limited to the disclosed embodiments. On the contrary, the claims cover various modifications and equivalent arrangements.

The invention claimed is:

1. A method in a relaying radio node adapted for use in a relaying communication system, wherein the relaying node is in bidirectional communication with at least a first and a second sending/receiving radio node, the method comprising receiving in the relaying radio node at least a first signal carrying at least first data and a second signal carrying at least second data, wherein the method further comprises:
   generating a reduced representation of at least the first and second signal, with a reduced information content as compared to the first and second data, the reduced representation generated by a joint non-linearly encoding operation; and
   transmitting the reduced representation to at least the first and the second sending/receiving radio node.

2. The method according to claim 1, wherein the first and second signal are received concurrently.

3. The method according to claim 2, wherein the first and second signal are received as a superimposed signal of the first and second signal.

4. The method according to claim 1, wherein the relaying node utilizes regenerative relaying and a first data packet associated to the first signal and a second data packet associated with the second signal is extracted, and
   in the step of generating a reduced representation a composite data packet is generated by a bitwise non-linear encoding operation acting on the first and second data packets; and
   in the transmitting step the composite data packet is transmitted.

5. The method according to claim 4, wherein the bitwise non-linear operation is an XOR-operation.

6. The method according to claim 4, wherein one of the first and second data packets is longer than the other and the shorter of the data packets is extended prior to the non-linear encoding operation.

7. The method according to claim 6, wherein the shorter of the data packets is extended by repetition coding or replaced by a FEC coded version of the data packet.

8. The method according to claim 6, wherein the shorter of the data packets is extended by padding additional bits.

9. The method according to claim 1, wherein the first and/or second data packet associated with the respective first and second signal is encoded with a first FEC codeword; and
   wherein the composite data packet of the reduced representation generated in the relaying node, is encoded with a second FEC codeword different from the first FEC codeword.

10. The method according to claim 9, wherein the FEC coding method is one of:
    convolutional codes, algebraic codes, block codes, turbo codes, or low density parity codes.

11. The method according to claim 9, wherein the second FEC codeword is generated by the use of an invertible FEC codeword.

12. The method according to claim 9, wherein a common low rate codeword is used for both the first and/or second data packets and the composite data packet, and different first and second FEC codewords are generated by punctuating the common codeword differently.

13. The method according to claim 1, wherein the relaying node utilizes non-regenerative relaying, and
    in the step of generating a reduced representation a composite signal is generated by a modulus operation acting on the first and second signal; and
    in the transmitting step the composite signal is transmitted.

14. The method according to claim 13, wherein the first and the second signal each consists of numerical values, and wherein the generating of the composite signal comprises:
    quantization of the first signal into a first set consisting of one or more elements in the form of scalars or vectors;
    quantization of the second signal into second set consisting of one or more elements in the form of scalars or vectors; and
    performing the joint non-linear encoding operation on elements from both the first and the second set.

15. The method according to claim 14, wherein the numerical values represent information symbols.

16. The method according to claim 14, wherein the numerical values represent baseband samples.

17. A method in a sending/receiving radio node adapted for use in a relaying communication system, wherein the sending/receiving node is in communication with at least one relaying node, the method comprises the sending/receiving radio node transmitting at least a first signal carrying at least first data to the relaying radio node, wherein the method further comprises:
    storing the transmitted signal, the comprised data or a representation thereof, as a priori information;
    performing a non-linear decoding operation on a received signal, the received signal carrying a reduced representation of the first signal and at least a second signal carrying at least second data, the non-linear decoding operation utilizing the stored a priori known information associated with the first signal, whereby extracting the second signal or an information content associated to the second signal.

18. The method according to claim 17, wherein the non-linear decoding operation comprises a bitwise XOR-operation.

19. The method according to claim 17, wherein the non-linear decoding operation comprises a modulus-operation.

20. The method according to claim 17, wherein the receiving/sending node also receives the second signal in a separate unreduced form, and wherein the step of performing the non-linear decoding operation further comprises a combining operation of the second data extracted from the reduced representation and the second data associated with the unreduced received second signal.

21. The method according to claim 20, wherein in the step of performing the non-linear decoding and combining, the received signal carrying a reduced representation of the first signal and at least a second signal carrying at least second data, and the second signal in a separate unreduced form, is performed jointly with maximum likelihood decoding.

22. The method according to claim 20, wherein the performing of the non-linear decoding comprises:
    processing the reduced representation and the unreduced received second signal to obtain a first and a second sequence of soft bits;
    compensating the first sequence soft bits using the a priori knowledge associated to the first signal;
    combining the compensated first sequence and the second sequence of soft bits to improve quality of the soft bits; and
    performing a hard bit decision on the resulting sequence.

23. The method according to claim 20, wherein a second data packet associated with the second signal is encoded with a first FEC codeword; and
    wherein the composite data packet of the reduced representation, is encoded with a second FEC codeword different from the first FEC codeword, and wherein in said combining the data packet encoded with the first FEC codeword is used to enhance the interpretation of the information content of the corresponding data packet extracted from the composite data packet encoded with the second FEC codeword.

24. A communication method adapted for use in a relaying communication system, wherein a relaying node is in bidirectional communication with at least a first and a second sending/receiving radio node, wherein the method comprises the steps of:
the first sending/receiving node transmitting a first signal with associated first data to the relaying node, and the second sending/receiving node, transmitting a second signal with associated second data to the relaying node, and the first node and the second node storing their respective transmitted signals, associated data or representations thereof, as at least a part of their respective a priori known information;
the relaying node receiving the first and second signals;
the relaying node generating a reduced representation of the first and second signal by the use of a non-linear encoding operation;
the relaying node transmitting the reduced representation to the first and to the second radio node;
least one of the first and second sending/receiving node performing a non-linear decoding operation of the reduced representation with the use of its a priori known information, whereby extracting the second and/or first signal, respectively, or the second and/or first data, respectively.

25. The method according to claim 24, wherein in the relaying receiving step the first and second signal are received concurrently.

26. The method according to claim 25, wherein in the relaying receiving step the first and second signal are received as a superimposed signal of the first and second signal.

27. The method according to claim 25, wherein the relaying node utilizes regenerative relaying and a first data packet associated to the first signal and a second data packet associated with the second signal is extracted, and
in the step of generating a reduced representation a composite data packet is generated by a bitwise non-linear encoding operation acting on the first and second data packets; and
in the transmitting step the composite data packet is transmitted; and
in the step of performing a non-linear decoding operation in at least one of the first and second sending/receiving node a bitwise non-linear decoding operation is utilized to extract the second and/or first signal, respectively.

28. The method according to claim 27, wherein the bitwise non-linear encoding operation and the bitwise non-linear decoding operations are XOR-operations.

29. The method according to claim 27, wherein one of the first and second data packets is longer than the other and the shorter of the data packets is extended prior to the non-linear encoding operation.

30. The method according to claim 29, wherein the shorter of the data packets is extended by repetition coding or replaced by a FEC coded version of the data packet.

31. The method according to claim 29, wherein the shorter of the data packets is extended by padding additional bits.

32. The method according to claim 29, wherein the relaying node utilizes non-regenerative relaying, and
in the step of generating a reduced representation a composite signal is generated by a modulus operation acting on the first and second signal;
in the transmitting step the composite signal is transmitted; and
in the step of performing a non-linear decoding operation in at least one of the first and second sending/receiving node a modulus operation is utilized to extract the second and/or first signal, respectively.

33. The method according to claim 32, wherein the first and the second signal each consists of numerical values, and wherein the generating of the composite signal comprises:
quantization of the first signal into a first set consisting of one or more elements in the form of scalars or vectors;
quantization of the second signal into second set consisting of one or more elements in the form of scalars or vectors; and
performing the joint non-linear encoding operation on elements from both the first and the second set.

34. The method according to claim 33, wherein the numerical values represent information symbols.

35. The method according to claim 33, wherein the numerical values represent baseband samples.

36. The method according to claim 24, wherein the first receiving/sending node in addition receives the second signal in an separate unreduced form and/or the second receiving/sending node in addition receives the first signal in an separate unreduced form, and wherein the step of performing the non-linear decoding operation further comprises a combining operation of the signal of the reduced representation and the signal associated with the unreduced received first and/or second signal.

37. The method according to claim 36, wherein the non-linear decoding and combining of the received signal carrying a reduced representation and the signal in a separate unreduced form, is performed jointly with maximum likelihood decoding.

38. The method according to claim 36, wherein the performing of the non-linear decoding comprises:
processing the reduced representation and the unreduced received signal to obtain a first and a second sequence of soft bits;
compensating the first sequence soft bits using the a priori knowledge associated to the first or second signal;
combining the compensated first sequence and the second sequence of soft bits to improve quality of the soft bits; and
performing a hard bit decision on the resulting sequence.

39. The method according to claim 36, wherein the first and/or second data packet associated with the respective first and second signal is encoded with a first FEC codeword; and
wherein a composite data packet of the reduced representation generated in the relaying node is encoded with a second FEC codeword different from the first FEC codeword.

40. The method according to claim 39, wherein an FEC coding method used to encode the first and/or second FEC codewords is one of: convolutional codes, algebraic codes, block codes, turbo codes, or low density parity codes.

41. The method according to claim 39, wherein the second FEC codeword is generated by the use of invertible FEC codewords.

42. The method according to claim 39, wherein a common low rate codeword is used for the first and/or second signals and the composite data packet, and different first and second FEC codewords are generated by punctuating the common codeword differently.

43. The method according to claim 24, wherein the relaying communication system is a multihop system, and the first sending/receiving radio node is a first end node and the second sending/receiving radio node is a second end node in a multihop chain comprising at least a first and a second relaying node.

44. The method according to claim 43, further comprising the steps of:
  at least one of the relaying nodes storing as it's a priori information, the first or second signal, or the first or second data associated with the first and second signal;
  the at least one relaying node receiving a reduced representation from at least one other relaying node; and
  the at least one relaying node performing a non-linear decoding operation utilizing its stored a prior information.

45. A relaying radio node adapted for bidirectional communication with at least a first and a second sending/receiving radio node in a relaying communication system, the relaying node comprising transceiver circuitry provided with a transmitting part and a receiving part, and wherein the relaying node comprises:
  a non-linear encoding module, which via a signal processing module is in connection with the transmission part and the receiving part, the non-linear encoding module adapted to generate a reduced representation of at least a first and second received signal, with a reduced information content as compared to the first and second signal, the reduced representation generated by a joint non-linearly encoding operation.

46. The relaying node according to claim 45, further comprising a temporary storage module in connection with the receiving part and with the non-linear encoding module, and adapted to store a first received signal to be retrieved in the non-linear encoding operation with a second received signal performed by the non-linear encoding module.

47. The relaying node according to claim 45, wherein the relaying node is adapted for use in a multihop communication, the relaying node further comprising a non-linear decoding module in connection with the receiving part, and adapted to decode a received reduced representation by a non-linear decoding operation.

48. The relaying node according to claim 45, wherein the signal processing module is a demodulation and FEC-decoding module.

49. The relaying node according to claim 45, wherein the signal processing module is a scaling module.

50. A sending/receiving radio node adapted for bidirectional communication with at least a second sending/receiving radio node via at least one relaying node, in a relaying communication system, the sending/receiving node comprising transmitting/receiving means provided with a transmitting part and a receiving part, and wherein the sending/receiving node comprises:
  a storage module for storing a priori knowledge such as sent signals;
  a non-linear decoding module in connection to, and arranged to retrieve a priori information from, the storage module, the non-linear decoding module adapted to perform a non-linear decoding operation on a received reduced representation utilizing a priori information retrieved from the storage module.

51. The sending/receiving node according to claim 50, further comprising:
  a demodulation and FEC decoding module, which is in connection with the receiving part and the non-linear decoding module;
  a modulation and FEC encoding module, which in connection with the transmitting part forms a transmitting chain, and adapted to receive data packets to be transmitted, and arranged to provide the storage module with data packets to be transmitted.

52. The sending/receiving node according to claim 50, further comprising:
  a demodulation and FEC decoding module, which is in connection with the non-linear decoding module;
  a modulation and FEC encoding module, which in connection with the transmitting parts forms a transmitting chain, and adapted to receive data packets to be transmitted, and arranged to provide the storage module with data packets to be transmitted, and
  wherein the non-linear decoding module is in connection with the receiving part, and arranged between the receiving part and the demodulation and FEC decoding module.

* * * * *

UNITED STATES PATENT AND TRADEMARK OFFICE
CERTIFICATE OF CORRECTION

PATENT NO.        : 7,920,501 B2                                 Page 1 of 1
APPLICATION NO.   : 11/794473
DATED             : April 5, 2011
INVENTOR(S)       : Larsson et al.

It is certified that error appears in the above-identified patent and that said Letters Patent is hereby corrected as shown below:

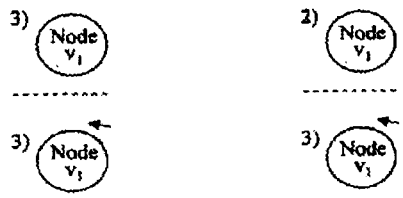

In Fig. 1b, Sheet 1 of 10, delete " ---------- " and insert -- ---------- --, therefor.

In Fig. 6c, Sheet 8 of 10, delete "vector quanitzation" and insert -- vector quantization --, therefor.

In Column 2, Line 15, delete "direction." and insert -- direction, --, therefor.

In Column 4, Line 39, delete "node; and" and insert -- node. --, therefor.

In Column 5, Line 30, delete "of the present invention two" and insert -- two --, therefor.

In Column 6, Line 49, delete "may be" and insert -- method may be --, therefor.

In Column 7, Line 30, delete "its" and insert -- it --, therefor.

In Column 14, Line 36, delete "embodiments" and insert -- embodiments utilizing --, therefor.

In Column 15, Line 19, delete "invertible" and insert -- invertable --, therefor.

In Column 18, Line 31, delete "far" and insert -- for --, therefor.

In Column 21, Line 25, in Claim 24, delete "least" and insert -- at least --, therefor.

Signed and Sealed this
Seventeenth Day of April, 2012

David J. Kappos
*Director of the United States Patent and Trademark Office*